United States Patent
Gustafson et al.

(10) Patent No.: US 11,714,212 B1
(45) Date of Patent: Aug. 1, 2023

(54) CONFORMAL OPTICAL COATINGS FOR NON-PLANAR SUBSTRATES

(71) Applicant: Apple Inc., Cupertino, CA (US)

(72) Inventors: Timothy M. Gustafson, Santa Clara, CA (US); Isamu Konishiike, Yokohama (JP); Ligang Wang, San Jose, CA (US); Ryozo Fukuzaki, Kobe (JP); Andrej Halabica, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/472,454

(22) Filed: Sep. 10, 2021

Related U.S. Application Data

(60) Provisional application No. 63/078,269, filed on Sep. 14, 2020.

(51) Int. Cl.
*G02B 1/118* (2015.01)
*G02B 1/113* (2015.01)
(Continued)

(52) U.S. Cl.
CPC ......... *G02B 1/113* (2013.01); *C23C 16/0272* (2013.01); *C23C 16/402* (2013.01);
(Continued)

(58) Field of Classification Search
CPC ........ G02B 5/281; G02B 5/282; G02B 5/285; G02B 5/286; G02B 5/288;
(Continued)

(56) References Cited

U.S. PATENT DOCUMENTS

2009/0022954 A1* 1/2009 Kotani ............... C03C 17/3417
428/148
2009/0081361 A1* 3/2009 Yamada ................. G02B 1/118
427/162
(Continued)

FOREIGN PATENT DOCUMENTS

JP 2015114381 A * 6/2015 ............. C23C 16/40
WO WO-2020066428 A1 * 4/2020 ............. C23C 16/40

OTHER PUBLICATIONS

Machine translation of JP 2015/114381 A, obtained from EspaceNet.*
(Continued)

*Primary Examiner* — Z. Jim Yang
(74) *Attorney, Agent, or Firm* — Robert C. Kowert; Kowert, Hood, Munyon, Rankin & Goetzel, P.C.

(57) ABSTRACT

Optical coatings for curved or non-planar substrates are disclosed. Optical coatings may include AR (antireflection) coatings or absorbing ("black" optical) coatings. The optical coatings may include a nanostructure layer formed on top of a stack of one or more materials. Both the nanostructure layer and the stack may be deposited on a curved or non-planar substrate using plasma-enhanced atomic layer deposition (PEALD) to provide conformal coating of the substrate. The nanostructure layer may include a mixture of aluminum hydroxide and aluminum oxide hydroxide that is formed by placing a PEALD-deposited aluminum oxide layer in heated deionized water for a predetermined time period. The materials in the stack may be alternated to provide tuning of the optical properties in the optical coating.

18 Claims, 21 Drawing Sheets

(51) Int. Cl.
  *C23C 16/455* (2006.01)
  *C23C 16/02* (2006.01)
  *C23C 16/56* (2006.01)
  *C23C 16/40* (2006.01)

(52) U.S. Cl.
  CPC ...... *C23C 16/403* (2013.01); *C23C 16/45536* (2013.01); *C23C 16/56* (2013.01); *G02B 1/118* (2013.01)

(58) Field of Classification Search
  CPC ...... G02B 1/11–118; G02B 1/14; G02B 1/18; C03C 2217/73; C03C 2217/734; C23C 14/081; C23C 16/403; G02F 1/133514; G02F 1/133521; G02F 1/133302; G02F 1/133305; G02F 1/133331
  See application file for complete search history.

(56) References Cited

U.S. PATENT DOCUMENTS

| | | | | |
|---|---|---|---|---|
| 2012/0207973 A1* | 8/2012 | Sakai | ................ | G02B 1/02 428/141 |
| 2014/0177059 A1* | 6/2014 | Ishimatsu | .............. | G02B 1/118 359/586 |
| 2015/0219798 A1* | 8/2015 | Sonoda | ................ | G02B 1/115 359/601 |
| 2015/0219799 A1* | 8/2015 | Sonoda | ................ | G02B 1/118 204/192.1 |
| 2015/0378058 A1* | 12/2015 | Sonoda | ............... | G02B 5/0294 427/164 |
| 2016/0054476 A1* | 2/2016 | Choi | ..................... | G02B 1/118 428/148 |
| 2016/0061996 A1* | 3/2016 | Ishimatsu | ............. | G02B 1/118 359/586 |
| 2017/0001905 A1* | 1/2017 | Sonoda | ............... | C03C 17/3411 |
| 2017/0176644 A1* | 6/2017 | Nakayama | ............. | B32B 27/20 |
| 2018/0011224 A1* | 1/2018 | Takahashi | ............... | B32B 15/04 |
| 2018/0127310 A1* | 5/2018 | Keech | .................... | C23C 14/50 |
| 2018/0156942 A1* | 6/2018 | Makino | ................... | G02B 1/111 |
| 2019/0010607 A1* | 1/2019 | Rückerl | ............... | H10K 50/854 |
| 2019/0229136 A1* | 7/2019 | Hayashi | ........... | H01L 27/14649 |
| 2019/0346590 A1* | 11/2019 | Huang | ................... | G02B 1/115 |
| 2020/0071820 A1* | 3/2020 | Herle | ................. | C23C 16/4481 |
| 2020/0408955 A1* | 12/2020 | Nakamura | ............ | G02B 1/118 |
| 2020/0408956 A1* | 12/2020 | Thothadri | ............... | G02B 1/18 |
| 2021/0032744 A1* | 2/2021 | Huang | ................... | C23C 16/30 |
| 2021/0163348 A1* | 6/2021 | Gump | .................... | C03C 17/28 |
| 2022/0373716 A1* | 11/2022 | Iwata | ................... | C03C 21/002 |

OTHER PUBLICATIONS

Kristin Pfeiffer, et al., "Antireflection Coatings for Strongly Curved Glass Lenses by Atomic Layer Deposition", Coatings 2017, Retrieved from www.mdpi.com/journal.coatings, pp. 1-12.

Pallabi Paul, et al., "Antireflection Coating on PMMA Substrates by Atomic Layer Deposition", Coatings 2020, Retrieved from www.mdpi.com/journal/coatings, pp. 1-13.

Christoffer Kauppinen, et al., "Grass-like Alumina with Low Refractive Index for Scalable, Broadband, Omnidirectional Antireflection Coatings on Glass Using Atomic Layer Deposition", ACS Applied Materials & Interfaces, Retrieved from https://pubs.acs.org/doi/pdf/10.1021/acsami.7b1733# on Jun. 26, 2020, pp. 1-5.

Lilit Ghazaryan, et al., "On the Properties of Nanoporous SiO2 Films for Single Layer Antireflection Coating", Advanced Engineering Materials, vol. 21, Issues 6, Mar. 18, 2019, Retrieved from https://onlinelibrary.wiley.com/doi/abs/10.1002/adem.201801229 on Jun. 26, 2020, pp. 1-3.

* cited by examiner

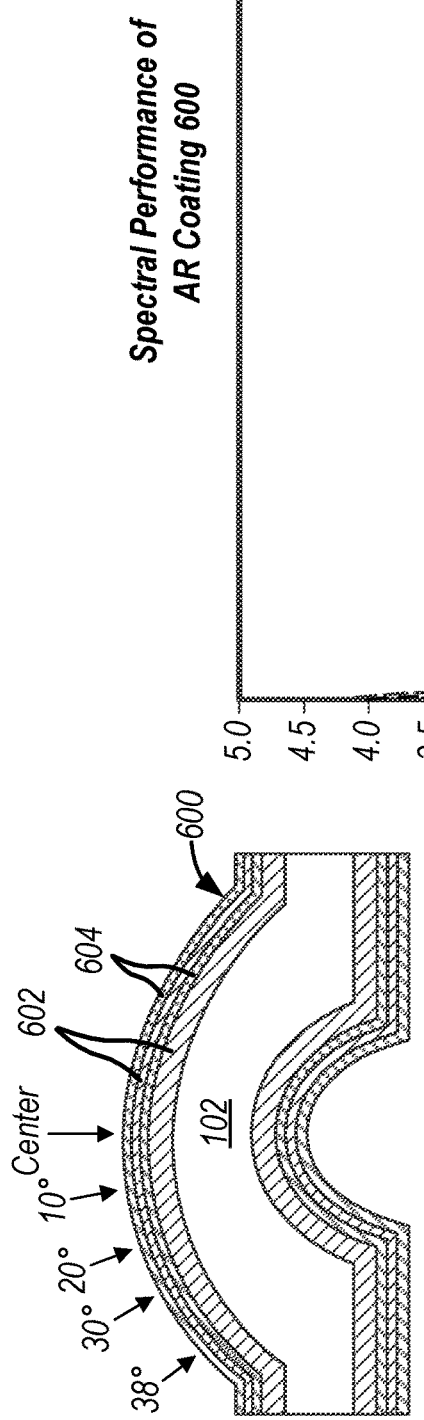
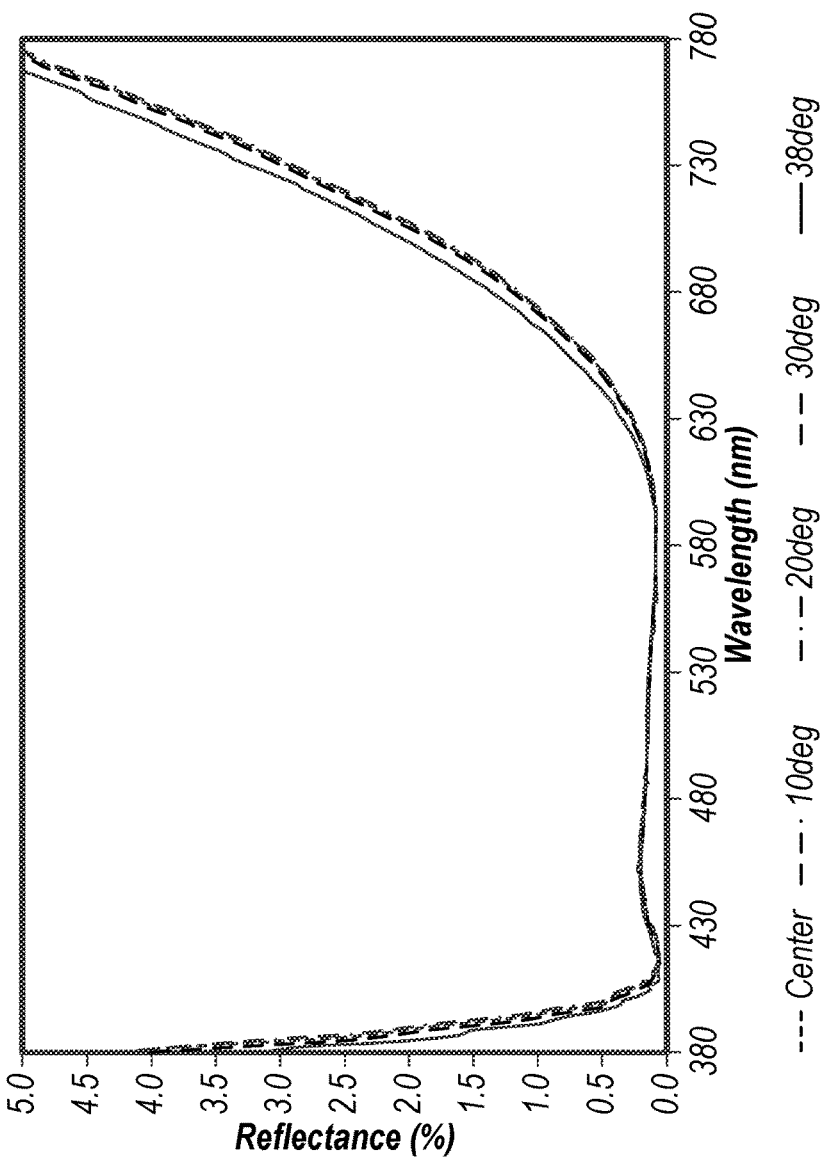
FIG. 6
FIG. 7

Boehmite
(γ-Aluminum oxide)

Bayerite
(β-Aluminum hydroxide)

CONFORMAL OPTICAL COATINGS FOR NON-PLANAR SUBSTRATES

PRIORITY CLAIM

This application claims the benefit of U.S. Provisional Application No. 63/078,269, filed on Sep. 14, 2020, which is incorporated by reference herein in its entirety.

BACKGROUND

Technical Field

Embodiments described herein relate to optical coatings. More particularly, embodiments described herein relate to antireflection coatings or absorbing coatings for curved or non-planar substrates such as optical lenses.

Description of the Related Art

Antireflection (AR) coatings are coated on lenses in many optical devices to reduce reflection on the optical lenses. Reducing the reflection on the optical lenses may improve efficiency of the optical device by reducing light loss due to reflection. An AR coating for a visible range optical lens (e.g., an optical lens used in a visible wavelength range) is typically a multilayer interference coating made of dielectric materials such as inorganic oxides, inorganic fluorides, and/or inorganic nitrides. Such a typical AR coating may be formed by alternating a first material with a high refractive index with a second material with a low refractive index. Examples of high refractive index materials include titanium dioxide ($TiO_2$), niobium oxide ($Nb_2O_5$), tantalum oxide ($Ta_2O_5$), zirconium oxide ($ZrO_2$), hafnium oxide ($HfO_2$), and silicon nitride ($Si_3N_4$). Examples of low refractive index materials include aluminum oxide ($Al_2O_3$), silicon dioxide ($SiO_2$), and magnesium fluoride ($MgF_2$). Performance of the AR coating may be dependent on the refractive index of the low refractive index material, especially in the visible range. For example, magnesium fluoride has a low refractive index of 1.38 at 550 nm, which limits the reflectance achievable for visible range AR coatings.

Absorbing coatings (which may be referred to as "black" optical coatings") are non-transparent, non-reflective coatings for surfaces in optical devices. Absorbing coatings may be used on surfaces to prevent glare or other light reflection from interfering with the transmission of light through optical devices. For example, absorbing coatings may be placed on stainless steel surfaces in optical devices to prevent reflection from the stainless steel material. An absorbing coating may have a multilayer interference structure that is similar in structure to an AR coating where the structure includes absorbing materials along with transparent materials. Absorbing materials may include, for example, titanium, tantalum, or silicon-based materials with high absorption in the visible wavelength range. Specific examples of absorbing materials include, but are not limited to, silicon hydride (SiH), titanium nitride (TiN), and titanium aluminum nitride (TiAlN). Transparent materials that may be used in the multilayer interference structure include, but are not limited to, dielectric materials such as silicon dioxide ($SiO_2$), titanium dioxide ($TiO_2$), and aluminum oxide ($Al_2O_3$). Performance of the absorption coating may be dependent on the absorption properties of the absorbing materials.

SUMMARY

To provide an optical coating (such as an antireflection (AR) coating) on a curved, polymeric substrate, a conformal coating of dielectric materials is formed on the substrate using atomic layer deposition. The conformal coating may include multiple layers of dielectric material with a top layer of aluminum oxide. In some embodiments, the layers of dielectric material below the top layer of aluminum oxide are stacked dielectric layers that provide tunable optical properties (e.g., index of refraction) depending on the dielectric materials in the stack. The top layer of aluminum oxide is then placed in heated deionized (DI) water for a predetermined time period to transform the aluminum oxide layer into a nanostructure layer. The nanostructure layer may include a mixture of Boehmite, Gibbsite, and Bayerite (e.g., a mixture of aluminum oxide, aluminum hydroxide, and aluminum oxide hydroxide in different crystalline polymorphs). In certain embodiments, the combination of the stacked dielectric layers and the nanostructure layer provides an AR coating on the curved, polymer substrate with an average reflectance of at most about 0.05% and with little to no angular shift in the spectral performance.

To provide an optical coating (such as an absorbing coating) on a non-planar substrate, a conformal coating of inorganic materials is formed on the substrate using atomic layer deposition. The conformal coating may include multiple layers of inorganic material (e.g., a combination of absorbing materials and transparent materials) with a top layer of aluminum oxide. In some embodiments, the layers of inorganic material below the top layer of aluminum oxide are stacked layers that provide tunable optical properties (e.g., lightness value) depending on the materials in the stack. The top layer of aluminum oxide is then placed in heated deionized (DI) water for a predetermined time period to transform the aluminum oxide layer into a nanostructure layer. The nanostructure layer may include a mixture of Boehmite, Gibbsite, and Bayerite (e.g., a mixture of different crystalline polymorphs of aluminum oxide, aluminum hydroxide (which may be Gibbsite or Bayerite), and aluminum oxide hydroxide (which may be Boehmite)). In certain embodiments, the combination of the stacked dielectric layers and the nanostructure layer provides an absorbing coating on the non-planar substrate with an average lightness value of at most about 0.3 over a high range of incidence angles (e.g., from 0° to about 40°).

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which:

FIG. 6 depicts a cross-sectional side-view representation of an example AR coating formed on a curved substrate using atomic layer deposition.

FIG. 7 depicts spectral performance of an AR coating deposited using atomic layer deposition as measured at different locations on the surface of a curved substrate.

Figure 1:
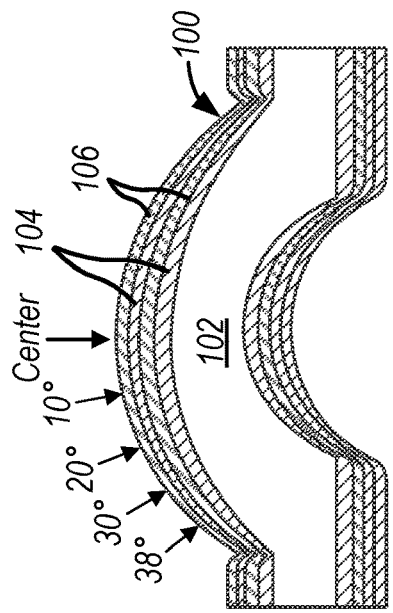
FIG. 1 depicts a cross-sectional side-view representation of an example AR (antireflection) coating formed on a curved substrate using physical vapor deposition.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure describes various techniques for forming AR coatings or absorbing coatings on optical lenses. A widely used current method for coating surfaces with optical coatings (e.g., AR coatings or absorbing coatings) is physical vapor deposition (PVD). PVD may include, for example, evaporation or sputtering of the materials for the optical coating onto a surface (e.g., a surface of an optical lens). One example of a PVD process is an electron beam (E-beam) deposition process. Optical coatings deposited using PVD, however, are non-conforming to the surface, which can be problematic with curved or non-planar substrates. For example, on curved or non-planar substrates, layer thickness of an optical coating deposited by PVD is dependent on the angle of vapor incidence during the PVD process. Such angle dependency may produce non-uniformity in the thickness of the optical coating that results in non-uniformity in the reflectance spectrum across the surface of the curved or non-planar substrate.

Atomic layer deposition (ALD) is another method that has been proposed to coat surfaces with optical coatings. An ALD process may be capable of coating a conformable optical coating on a curved or non-planar substrate. Thermal ALD processes are typically operated, however, at temperatures that are not suitable for plastic lens substrates. Recent developments in plasma-enhanced ALD (PEALD), however, have reduced ALD process temperatures into ranges suitable for plastic lens substrates (e.g., processing temperatures below about 100° C.).

Another method that has been proposed for optical coatings is forming a nanostructure material on flat substrates or glass substrates. The nanostructure material is formed by depositing a layer of dielectric material (e.g., aluminum oxide) on the flat substrate by PVD (e.g., electron beam (E-beam) deposition) followed by submerging the deposited layer in hot water for a period of time. The submersion transforms the single layer of aluminum oxide into a nanostructure that may include Gibbsite (aluminum hydroxide) and Boehmite (aluminum oxide hydroxide).

Such a nanostructure material may achieve a lower average reflectance for an AR coating than AR coatings formed by PVD or ALD (e.g., about 0.15% average reflectance as measured over 400 nm to 700 nm, from 0° to 30° angle of incidence). The nanostructure material, however, may not be tunable for different refraction indices or wavelengths and controlling the spectral performance may be difficult. Additionally, any variations or non-uniformity in the thickness of the layer deposited by PVD may adversely affect the optical performance of the subsequently formed nanostructure material. For example, variations or non-uniformity in the thickness of the PVD layer (e.g., variations of at least 10% in thickness) may actually cause reduction in the optical performance of the layer subsequent to the hot water treatment. In some instances, placing such a non-uniform layer in the hot water treatment may also create more non-uniformity in the layer.

FIG. 1 depicts a cross-sectional side-view representation of an embodiment of an AR coating formed on a curved substrate using PVD. In FIG. 1, AR coating 100 is formed on curved substrate 102 using PVD. AR coating 100 includes layers of first dielectric material 104 alternating with layers of second dielectric material 106 deposited using PVD processes to form each of the layers. As shown in FIG. 1, because of the curved surface of substrate 102, the layers of first dielectric material 104 and second dielectric material 106 deposited using PVD may be non-uniform in thickness across the surface of the substrate.

Figure 2:
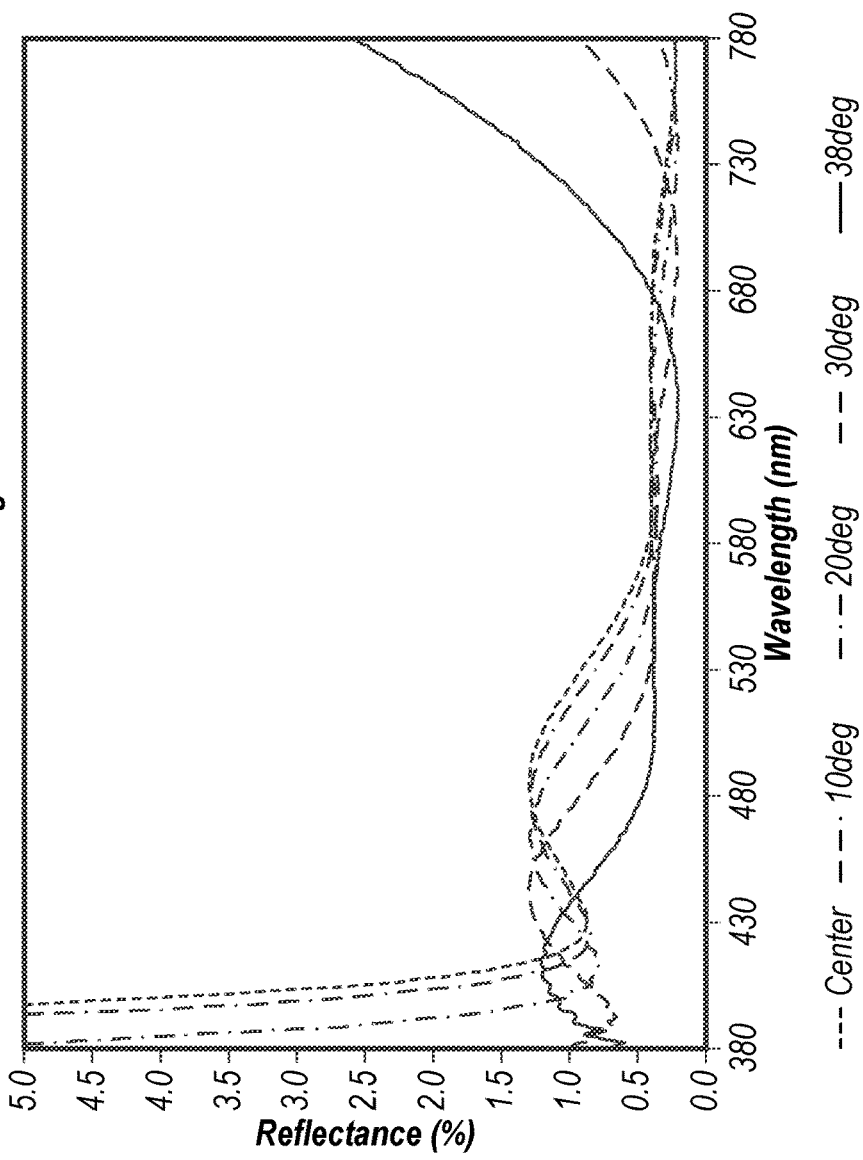
FIG. 2 depicts spectral performance of an AR coating deposited using physical vapor deposition as measured at different locations on the surface of a curved substrate.

The non-uniformity in the thickness of the layers of first dielectric material 104 and second dielectric material 106 may cause non-uniformity in the reflectance spectrum of the AR coating. FIG. 2 depicts spectral performance of AR coating 100 measured at different locations on the surface of substrate 102. The different locations on the surface of substrate 102 are shown by the arrows in FIG. 1, which indicate different angles from center (perpendicular to substrate). FIG. 2 depicts spectral performance measured by reflectance (in %) at different wavelengths between 380 nm and 780 nm. As shown in FIG. 2, the spectral performance of AR coating 100 is non-uniform across the surface of substrate 102. The non-uniformity in the reflectance spectrum (as shown by the spectral performance shown in FIG. 2) may limit the average reflectance achievable for AR coatings deposited by PVD to average reflectances of about 0.7% or higher (as measured over 400 nm to 700 nm, from 0° to 30° angle of incidence).

Absorbing coatings deposited using PVD processes may have similar issues with thickness uniformity across the surface. As absorbing coatings are typically deposited on surfaces with changing topographies (e.g., angle changes, height changes, three-dimensional structures, etc.), PVD deposition of absorbing coatings may be difficult to have uniform thickness on such non-planar surfaces.

Figure 3:
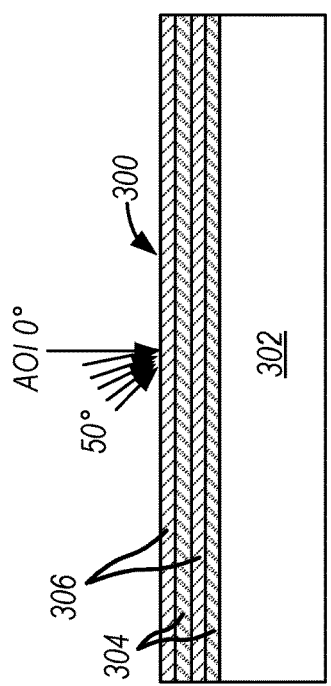
FIG. 3 depicts a cross-sectional side-view representation of an example absorbing coating formed on a flat substrate using PVD.

In some embodiments, multilayer absorbing coatings deposited on flat surfaces using PVD processes have a change in performance based on angle of incidence (AOI) on the surface. FIG. 3 depicts a cross-sectional side-view representation of an embodiment of an absorbing coating formed on a flat substrate using PVD. In FIG. 3, absorbing coating 300 is formed on flat substrate 302 using PVD. Absorbing coating 300 includes layers of first dielectric material 304 alternating with layers of second dielectric material 306 deposited using PVD processes to form each of the layers.

Figure 4:
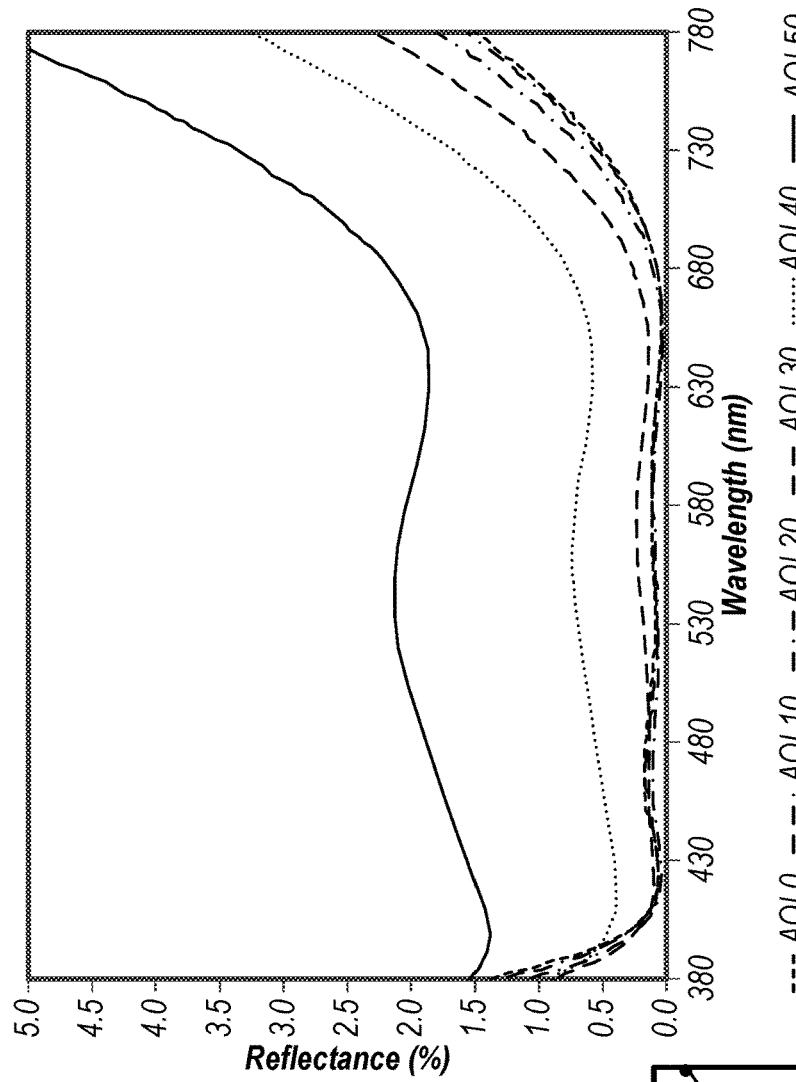
FIG. 4 depicts spectral performance of an absorbing coating as theoretically determined at different angle of incidence on the surface of a substrate.

FIG. 4 depicts spectral performance of absorbing coating 300 as theoretically determined at different angle of incidence on the surface of substrate 302. The different angles of incidence are 0°, 10°, 20°, 30°, 40°, and 50° where the light is incident on the surface of substrate 302 (shown in FIG. 3). FIG. 4 depicts the spectral performance theoretically determined by reflectance (in %) at different wavelengths between 380 nm and 780 nm. As shown in FIG. 4, the reflectance varies based on the angle of incidence and there is angular shift in the wavelength range as the angle of incidence increases. Additionally, at higher angles of incidence (e.g., greater than 40°), the reflectance increases and the angular shift also continues to increase.

Figure 5:
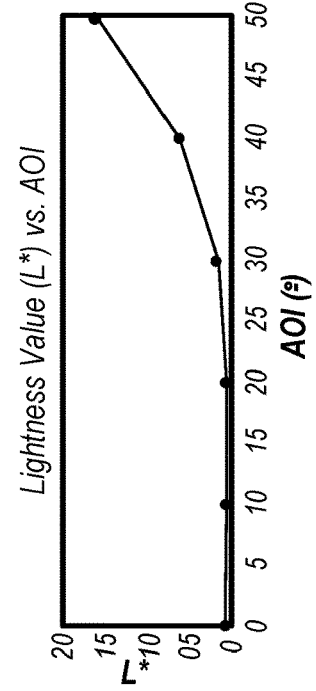
FIG. 5 depicts lightness value theoretically determined versus angle of incidence for an absorbing coating on a substrate.

FIG. 5 depicts the lightness value (L*) theoretically determined versus angle of incidence for absorbing coating 300 on substrate 302. As used herein, the term "lightness value (L*)" refers to the L* value from the 1976 CIELAB color space. In some instances, the lightness value may be referred to as relative luminance. As shown in FIG. 5, the lightness value increases dramatically at angles of incidence above about 30° or 40°. Thus, high absorbance performance (as measured by lightness value) may be difficult to achieve across a wide range of angles (e.g., L* may be only in a high performing range for angles lower than about 40°).

In some embodiments, ALD (atomic layer deposition) may be used to form an optical coating on a substrate. FIG. 6 depicts a cross-sectional side-view representation of an embodiment of an AR coating formed on a curved substrate using ALD. In FIG. 6, AR coating 600 is formed on curved substrate 102 using ALD. AR coating 600 includes layers of first dielectric material 602 alternating with layers of second dielectric material 604 deposited using ALD processes to form each of the layers. As shown in FIG. 6, the layers of first dielectric material 602 and second dielectric material 604 conform to the surface of substrate 102. The ALD processes used to form first dielectric material 602 and second dielectric material 604 may, however, be limited to dielectric materials that have limited ranges of optical indices of refraction. Thus, it may be difficult to achieve low average reflectances (e.g., average reflectances below about 0.3% as measured over 400 nm to 700 nm, from 0° to 30° angle of incidence) for AR coatings deposited using only ALD.

FIG. 7 depicts spectral performance of AR coating 600 measured at different locations on the surface of substrate 102. The different locations on the surface of substrate 102 are shown by the arrows in FIG. 6, which indicate different angles from center (perpendicular to substrate). FIG. 7 depicts spectral performance measured by reflectance (in %) at different wavelengths between 380 nm and 780 nm. As shown in FIG. 7, the wavelength range for low reflectance by AR coating 600 may be between about 400 nm and about 600 nm.

Figure 8:
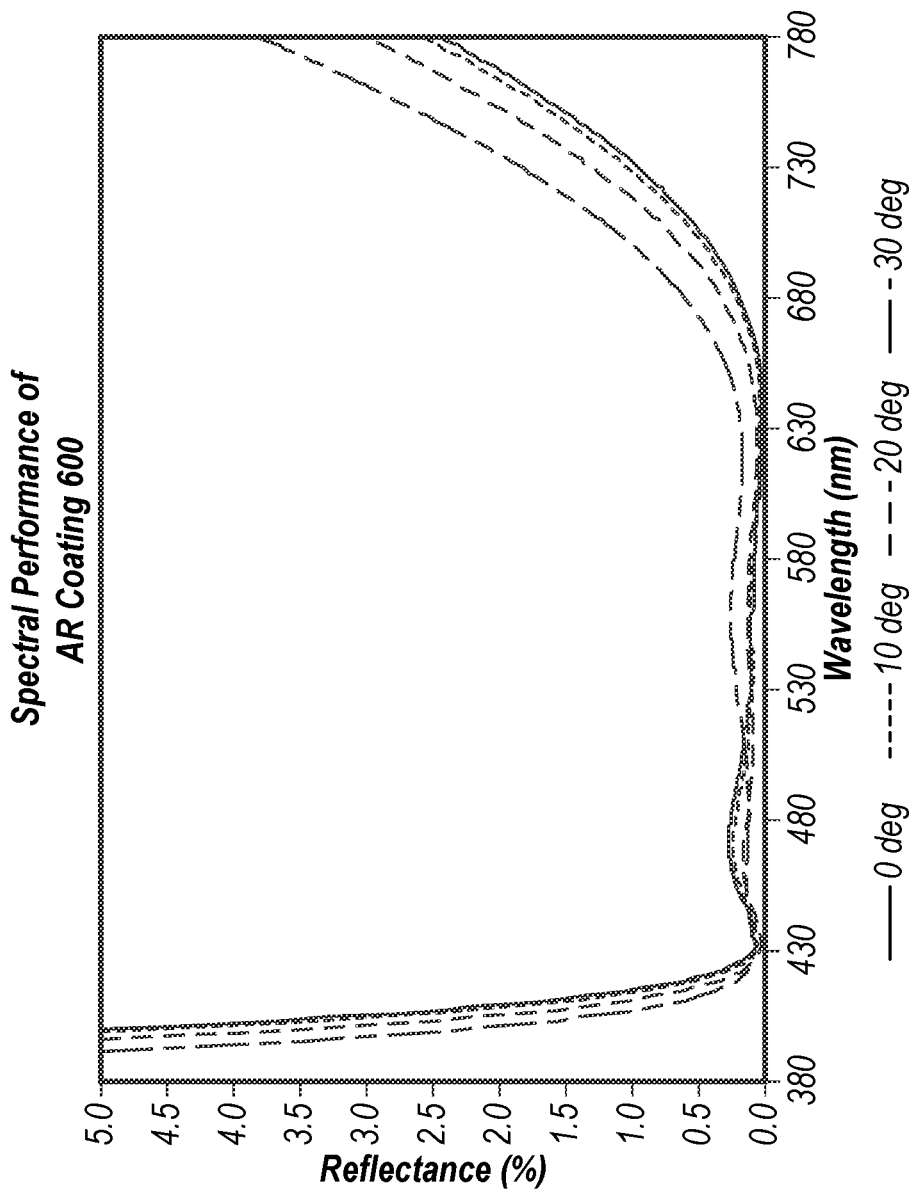
FIG. 8 depicts spectral performance of an AR coating deposited using atomic layer deposition as theoretically determined at different angle of incidence at the center position on the surface of a curved substrate.

FIG. 8 depicts spectral performance of AR coating 600 as theoretically determined at different angle of incidence at the center position on the surface of substrate 102. The different angles of incidence are 0°, 10°, 20°, and 30° where the light is incident at the center position on the surface of substrate 102 (shown in FIG. 6). FIG. 8 depicts the spectral performance theoretically determined by reflectance (in %) at different wavelengths between 380 nm and 780 nm. As shown in FIG. 8, the reflectance varies based on the angle of incidence and there is angular shift in the wavelength range as the angle of incidence increases. Additionally, at higher angles of incidence (e.g., greater than) 30°, the variance in reflectance may become more pronounced and the angular shift may also continue to increase.

In certain embodiments, as described herein, an optical coating is formed using a combination of ALD-deposited dielectric layers and a nanostructure material. Forming an optical coating using a combination of ALD-deposited dielectric layers and a nanostructure material may improve spectral performance of the optical coating compared to individual spectral performances of ALD-deposited dielectric layers or a nanostructure material. For example, the combination of ALD-deposited dielectric layers and the nanostructure material may lower the average reflectance of an AR coating compared to individual average reflectances of ALD-deposited AR coatings or a nanostructure material AR coating. Angular dependence of spectral performance may also be reduced by the combination of ALD-deposited dielectric layers and the nanostructure material. Absorbing properties for absorbing coatings may also be improved by the combination of ALD-deposited dielectric layers and the nanostructure material.

Figure 9:
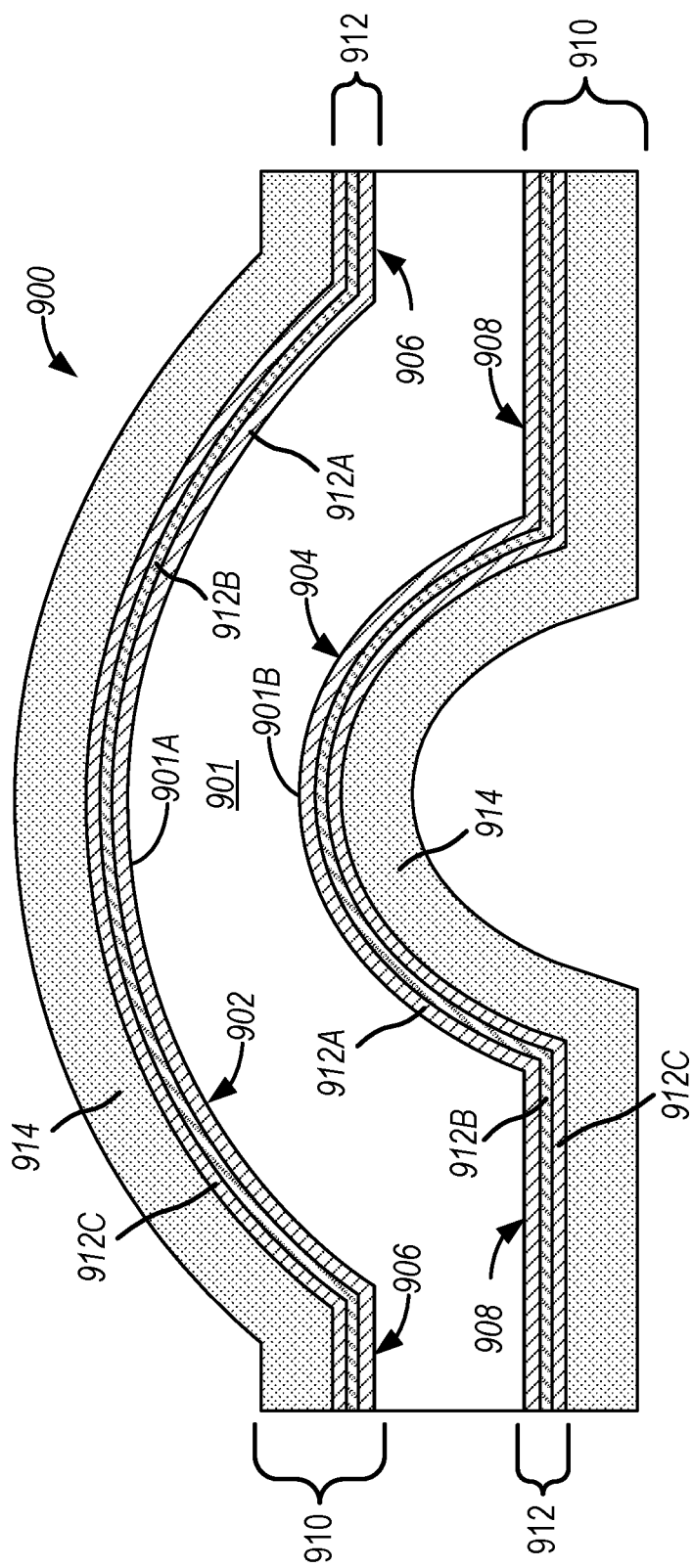
FIG. 9 depicts a cross-sectional representation of an antireflection coating formed on a curved substrate, according to some embodiments.

FIG. 9 depicts a cross-sectional representation of a structure having an antireflection coating formed on a curved substrate, according to some embodiments. Structure 900 includes substrate 901. In certain embodiments, substrate 901 is an optical lens. For example, substrate 901 may be an optical lens used in a camera or other optical device. In certain embodiments, substrate 901 is a polymeric substrate. Polymeric substrates may include, but not be limited to, cyclic olefin polymer substrates, cyclic olefin copolymer substrates, and thermoplastic substrates (such as poly(methyl methacrylate)(PMMA)).

In the depicted embodiment, substrate 901 is a curved planar substrate (e.g., the substrate is a non-planar or non-flat substrate). As used herein, a curved substrate includes a substrate where at least a portion of at least one surface of the substrate has a minimum angle of curvature. In certain embodiments, the minimum angle of curvature is at least about 20 degrees. The curvature of upper portion 902 or lower portion 904 may, however vary. For example, portions with a minimum angle of curvature of at least about 10 degrees or at least about 15 degrees may be contemplated for some embodiments. The curvature of portions of substrate 901 may vary based on, for example, properties (e.g., optical properties) of the substrate. For example, in some embodiments, optical lenses may have different curvatures implemented for different uses in an optical device such as providing different optical properties in the optical device.

In certain embodiments, as shown in FIG. 9, substrate 901 has two curved portions, curved upper portion 902 on upper surface 901A of the substrate and curved lower portion 904 on lower surface 901B of the substrate. In some embodiments, substrate 901 may include a surface that has one or more curved portions in combination with one or more flat portions along the surface. For example, as shown in the depicted embodiment, upper surface 901A of substrate 901 includes curved upper portion 902 along with two small, flat portions 906 and lower surface 901B includes curved lower portion 904 along with two flat portions 908. For embodiments with multiple curved portions on the surface of a substrate, the angles of curvature in the multiple curved portions on the surface may be the same for each curved portion or may vary between the curved portions.

In certain embodiments, AR (antireflection) coating 910 is formed on substrate 901. As shown in FIG. 9, AR coating 910 is formed on both upper surface 901A and lower surface 901B of substrate 901. Other embodiments may be contemplated where AR coating 910 is formed on only upper surface 901A or on only lower surface 901B.

In the depicted embodiment, AR coating 910 includes dielectric stack 912 and nanostructure layer 914 formed on substrate 901. In certain embodiments, dielectric stack 912 includes one or more dielectric layers (e.g., layers of dielectric material). Dielectric material utilized for the dielectric layers in dielectric stack 912 may include, but not be limited to, silicon oxides, silicon nitrides, transition metal oxides, and alkaline earth fluorides. Examples of these dielectric materials include, but are not limited to, titanium dioxide ($TiO_2$), niobium oxide ($Nb_2O_5$), tantalum oxide ($Ta_2O_5$), zirconium oxide ($ZrO_2$), hafnium oxide ($HfO_2$), silicon nitride ($Si_3N_4$), aluminum oxide ($Al_2O_3$), silicon dioxide ($SiO_2$), and magnesium fluoride ($MgF_2$). In certain embodiments, the dielectric layers are formed using a plasma-enhanced atomic layer deposition (PEALD) process, as described herein. An individual dielectric layer may be formed according to a PEALD process for the individual dielectric material in the layer. In some embodiments, the dielectric layers are formed using another ALD process. For example, thermal ALD processes that operate in low-temperature ranges below about 100° C. may be used to form the dielectric layers.

In some embodiments, as shown in FIG. 9, dielectric stack 912 includes multiple layers of dielectric material to form an interference coating. The interference coating may include alternating layers of dielectric material where the layers alternate between a high index of refraction material and a low index of refraction material. In such embodiments, the refractive index of the low refractive index material may determine the spectral performance of dielectric stack 912. High refractive index materials that may be used in dielectric stack 912 include, but are not limited to, titanium dioxide, niobium oxide, tantalum oxide, zirconium oxide, hafnium oxide, and silicon nitride. Low refractive index materials that may be used in dielectric stack 912 include, but are not limited to, aluminum oxide, silicon dioxide, and magnesium fluoride. In some embodiments, the difference in index of refraction between the low index material and the high index material is at least about 0.5. Other embodiments may be contemplated with the difference index of refraction being at least about 0.3, at least about 0.4, or at least about 0.6. The difference in index of refraction may range up to about 2.0 or higher depending on the dielectric materials used in the alternating layers.

In one embodiment, as shown in FIG. 9, dielectric stack 912 includes three layers of dielectric material (e.g., dielectric layers 912A, 912B, 912C). In certain embodiments, dielectric layer 912A is an adhesion layer for dielectric stack 912. For example, dielectric layer 912A may be an aluminum oxide ($Al_2O_3$) adhesion layer. The adhesion layer may be used to provide adhesion to substrate 901 that maintains adhesion between the dielectric layers and the substrate under typical operating conditions (e.g., typical operating temperatures).

In some embodiments, dielectric layer 912B and dielectric layer 912C may be alternating dielectric material layers formed on dielectric layer 912A (e.g., the adhesion layer). In such embodiments, dielectric layer 912B may include a high refraction index dielectric material and dielectric layer 912C may include a low refraction index material. Thus, dielectric stack 912 may include dielectric layer 912A (which is aluminum oxide and a low refraction index material), dielectric layer 912B (which is a high refraction index material such as titanium dioxide), and dielectric layer 912C (which is a low refraction index material such as silicon dioxide) with the three layers forming an interference coating.

While three dielectric layers (e.g., dielectric layers 912A, 912B, 912C) are shown in the embodiment depicted in FIG. 9, dielectric stack 912 may include any number of dielectric layers that provide desired optical and/or mechanical properties for AR coating 910. For example, in one embodiment, dielectric stack 912 may include a single layer of dielectric material in addition to the adhesion layer (such as a single layer of silicon dioxide on an aluminum oxide adhesion layer). Reducing the number of layers in dielectric stack 912 may also improve throughput of process for forming AR coating 910 (e.g., by reducing total process time needed by reducing number of layer depositions). In some embodiments, the number of layers in dielectric stack 912 is varied to provide a desired spectral performance from AR coating 910. The dielectric materials in the dielectric layers may also be varied to provide variances in indices of refraction in the dielectric layers and produce desired spectral performance from AR coating 910.

In some embodiments, dielectric stack 912 may have a thickness between about 100 nm and about 500 nm. The thickness of dielectric stack 912 may vary based on the number of layers, types of dielectric materials, and desired optical or mechanical properties of the dielectric stack. For example, smaller thicknesses may be contemplated with dielectric stack 912 only having one or two dielectric layers.

In the embodiment shown in FIG. 9, AR coating 910 includes nanostructure layer 914 formed on dielectric stack 912. In certain embodiments, nanostructure layer 914 is a nanostructure of aluminum oxide. As described herein, the nanostructure of aluminum oxide may be formed by depositing a layer of aluminum oxide (e.g., using PEALD) on dielectric stack 912 and placing the structure in heated deionized (DI) water for a predetermined time period. Placing the structure in heated DI water for the predetermined time period restructures the PEALD-deposited aluminum oxide to a nanostructure lattice of aluminum oxide (e.g., an aluminum oxide nanostructure).

Depositing the layer of aluminum oxide with PEALD may form the layer conformally on dielectric stack 912 and substrate 901. With the conformal deposition of the PEALD-deposited aluminum oxide on dielectric stack 912 and substrate 901, nanostructure layer 914 may also be conformal on the dielectric stack and substrate. In some embodiments, dielectric stack 912 includes a top layer of silicon dioxide. Silicon dioxide may be used in the top layer of dielectric stack 912 to provide adhesion between the dielectric stack and nanostructure layer 914 as silicon dioxide and PEALD-deposited aluminum oxide have good adhesion properties with respect to each other. The top layer of silicon dioxide may be dielectric layer 912C, shown in FIG. 9, or another thin layer of silicon dioxide deposited on top of dielectric layer 912C.

In various embodiments, nanostructure layer 914 includes a mixture of aluminum oxide, aluminum hydroxide, and aluminum oxide hydroxide. For instance, nanostructure layer 914 may include a mixture of crystalline polymorphs (different crystalline structures) of aluminum oxide, aluminum hydroxide, and aluminum oxide hydroxide. In certain embodiments, the mixture of crystalline polymorphs includes, but is not limited to, a mixture of Boehmite, Gibbsite, and Bayerite. Boehmite includes aluminum oxide hydroxide and may be referred to as γ-aluminum oxide, γ-AlO(OH), or α-AlOOH. Gibbsite includes aluminum hydroxide and may be referred to as γ-aluminum hydroxide (γ-Al(OH)$_3$). Bayerite is a variation of Gibbsite that also includes aluminum hydroxide. In some instances, Bayerite is referred to as α-aluminum hydroxide (α-Al(OH)$_3$) or β-aluminum hydroxide (β-Al(OH)3).

Figure 26A:
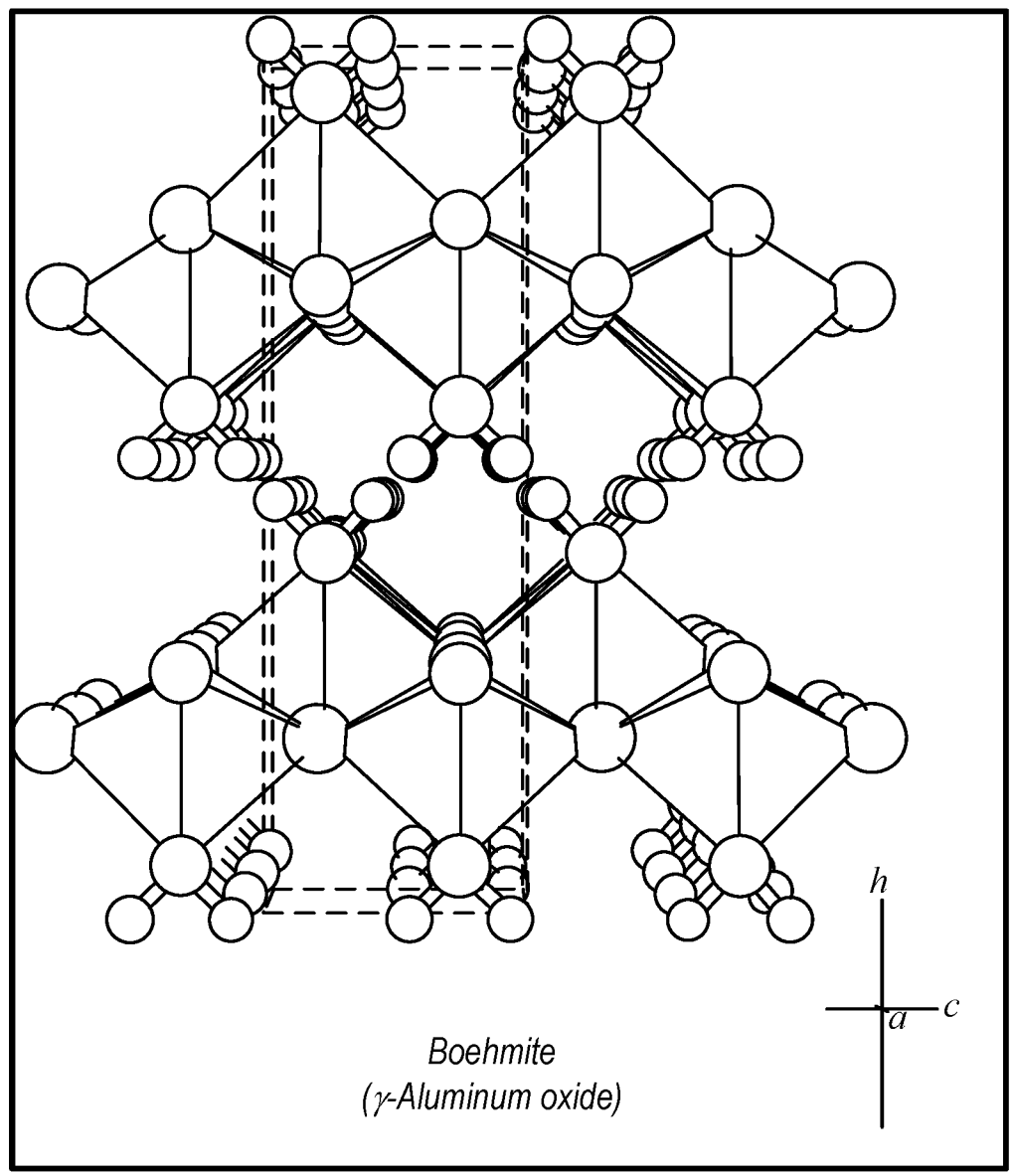
FIGS. 26A-C depicts examples of molecular structures of Boehmite, Gibbsite and Bayerite.
Figure 26B:
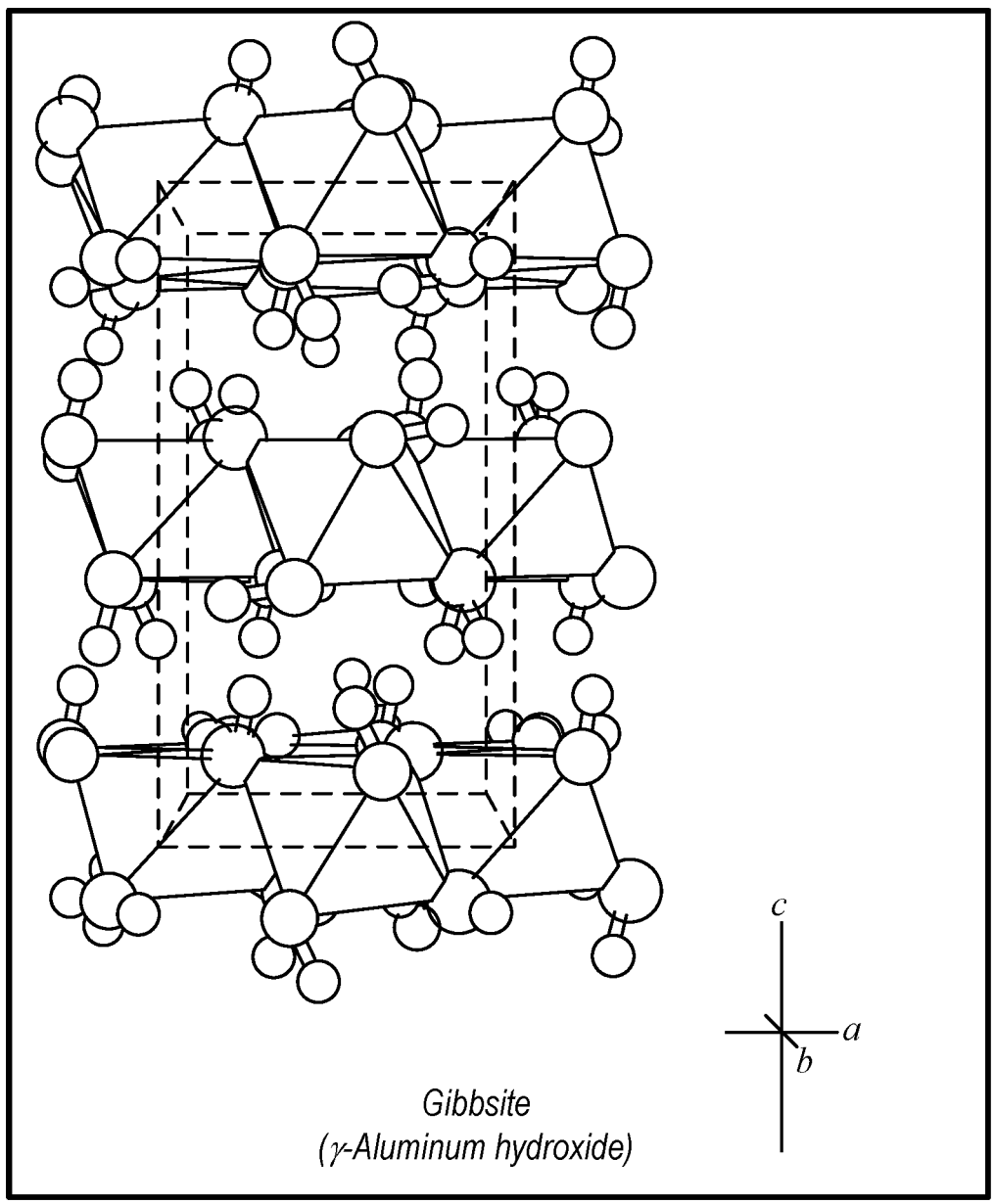
Figure 26C:
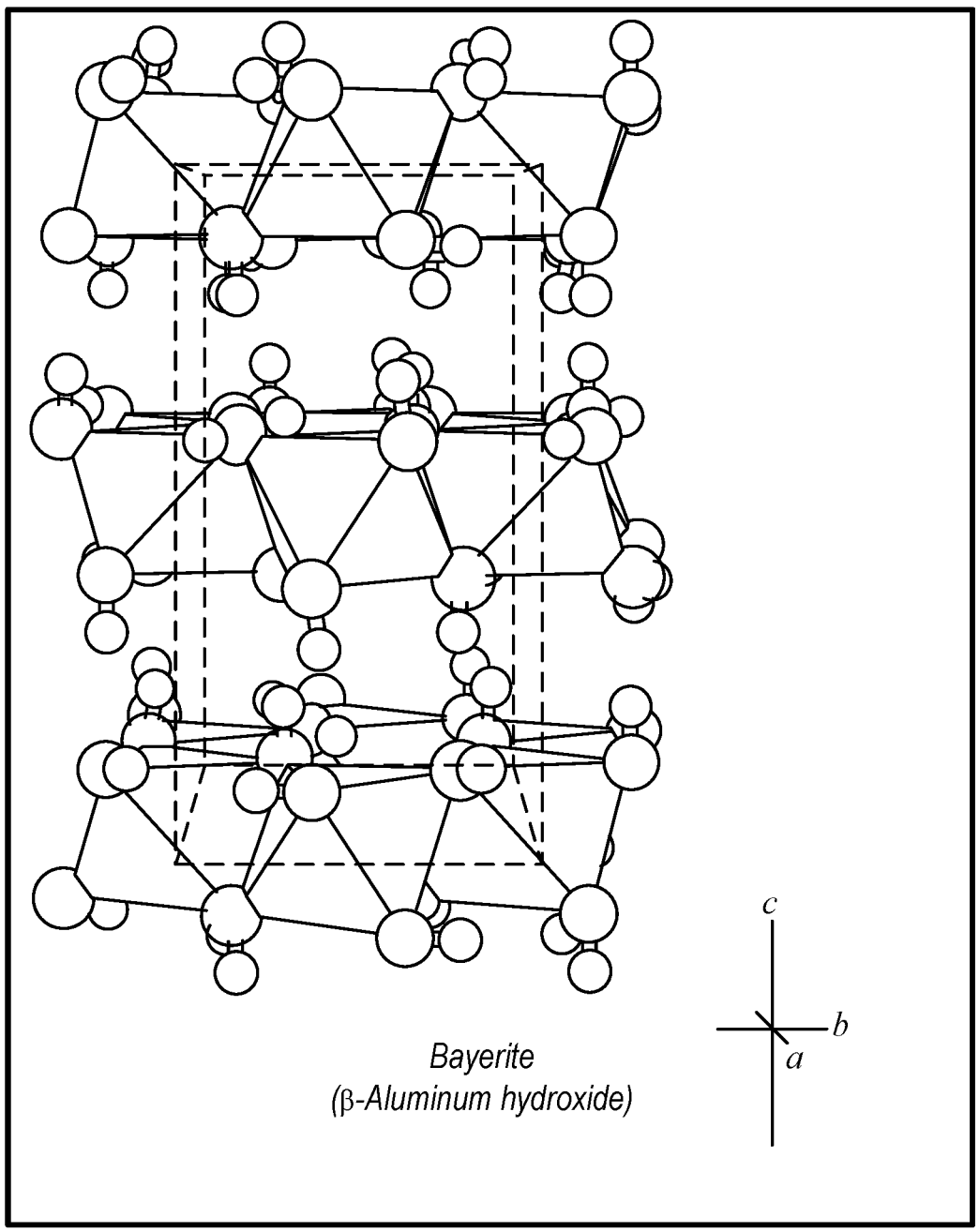

Examples of molecular structures of Boehmite, Gibbsite, and Bayerite are shown in FIGS. 26A-C, respectively. In various embodiments, Boehmite, Gibbsite, and Bayerite are crystalline polymorphs having different crystalline structures of aluminum oxide, aluminum hydroxide, and aluminum oxide hydroxide. Examples of different crystalline structures include, but are not limited to, orthorhombic (such as Boehmite), hexagonal (such as Bayerite), and monoclinic (such as Gibbsite). While embodiments disclosed herein describe nanostructure layer 914 as being a mixture of aluminum oxide, aluminum hydroxide, and aluminum oxide hydroxide or a mixture of Boehmite, Gibbsite, and Bayerite, it should be understood that other crystalline polymorphs of aluminum oxide, aluminum hydroxide, or aluminum oxide hydroxide may also be possible in the nanostructure layer. For example, other crystalline polymorphs may be possible under different processing conditions (e.g., different DI water temperatures and processing times).

The relative amounts of Boehmite, Gibbsite, and Bayerite along with the relative amount of aluminum oxide may vary depending on the structure of the aluminum oxide layer prior to treatment in heated DI water as well as the treatment parameters (e.g., temperature of DI water and treatment time in heated DI water). For example, the relative amounts may vary based on the amount of structural impurities in the PEALD-deposited aluminum oxide. Structural impurities may include, for example, non-crystalline impurities or chemical defects in the PEALD-deposited aluminum oxide such as, but not limited to, —OH groups, alkyl groups, and Al(OH)$_3$ groups. Treatment parameters in the heated DI water may also be varied to vary the amount of restructuring to the different crystalline polymorphs (e.g., Boehmite, Gibbsite, and Bayerite) that occurs in the PEALD-deposited aluminum oxide.

In certain embodiments, nanostructure layer 914 has a thickness between about 160 nm and about 260 nm. In some embodiments, nanostructure layer 914 has a thickness between about 170 nm and about 250 nm. In some embodiments, nanostructure layer 914 has a thickness between about 180 nm and about 240 nm. Other embodiments of thicknesses for nanostructure layer 914 may also be contemplated. For example, the thickness nanostructure layer 914 may be dependent on the temperature of DI water and time of treatment in the heated DI water. Typically, higher temperatures generate thinner layers while lower temperatures generate thicker layers. In various embodiments, the thickness of nanostructure layer 914 may be varied to tune the spectral performance (and other properties) of AR coating 910 in structure 900. For example, thinner thicknesses may be used to shift the spectral performance to lower wavelengths while thicker thicknesses may be used to shift spectral performance to higher wavelengths. As described herein, the thickness of nanostructure layer 914 may also be determined by the thickness of the PEALD-deposited aluminum oxide layer (e.g., aluminum oxide layer 2400, shown in FIGS. 24 and 25) prior to being treated in heated DI water.

Figure 10:
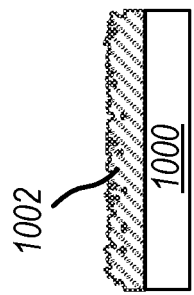
FIG. 10 depicts a cross-sectional representation of an embodiment of a flat substrate with an aluminum oxide nanostructure formed on the substrate.

As described above, an aluminum oxide nanostructure, such as nanostructure layer 914, may provide a lower average reflectance than dielectric layers formed by ALD (e.g., PEALD) without the additional heated DI water treatment. As an example, FIG. 10 depicts a cross-sectional representation of an embodiment of substrate 1000 with aluminum oxide nanostructure 1002 formed on the substrate. In the depicted embodiment, substrate 1000 is a flat substrate. Nanostructure 1002 may be formed by depositing a layer of aluminum oxide by either PVD or ALD (as substrate 1000 is flat, either PVD or ALD may be used to deposit the layer of aluminum oxide) and placing the structure in heated DI water for a predetermined time period. In certain embodiments, as shown in FIG. 10, nanostructure 1002 is a "grass-like" structure on substrate 1000.

Figure 11:
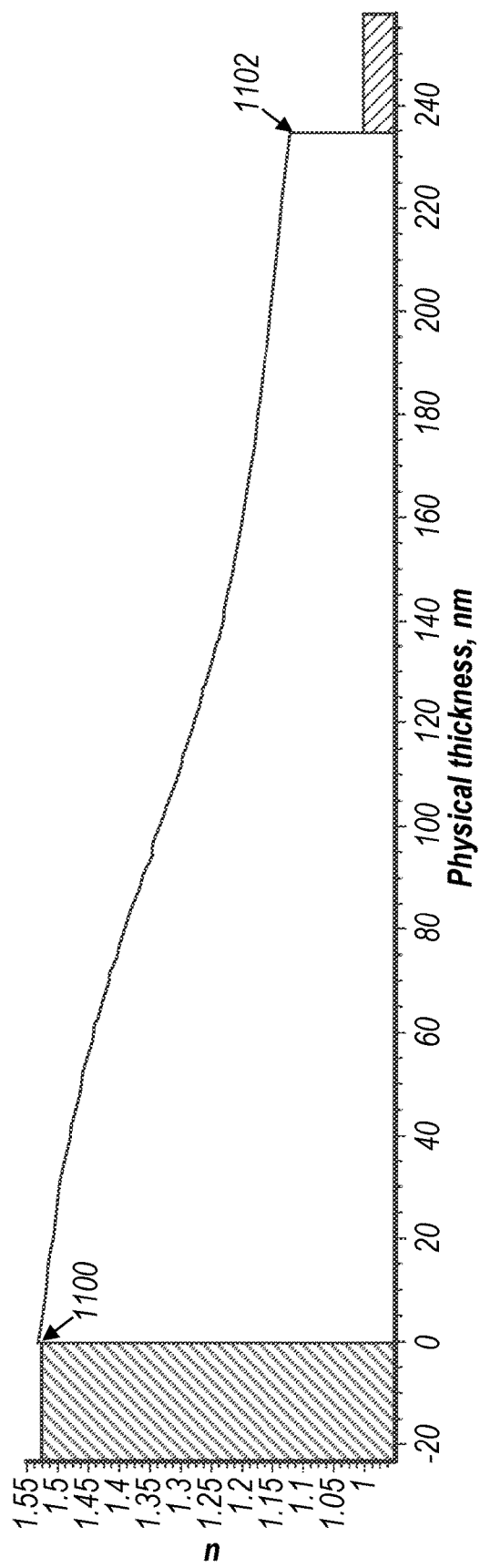
FIG. 11 depicts optical modeling of refraction index versus physical thickness for the embodiment depicted in FIG. 10.
Figure 12:
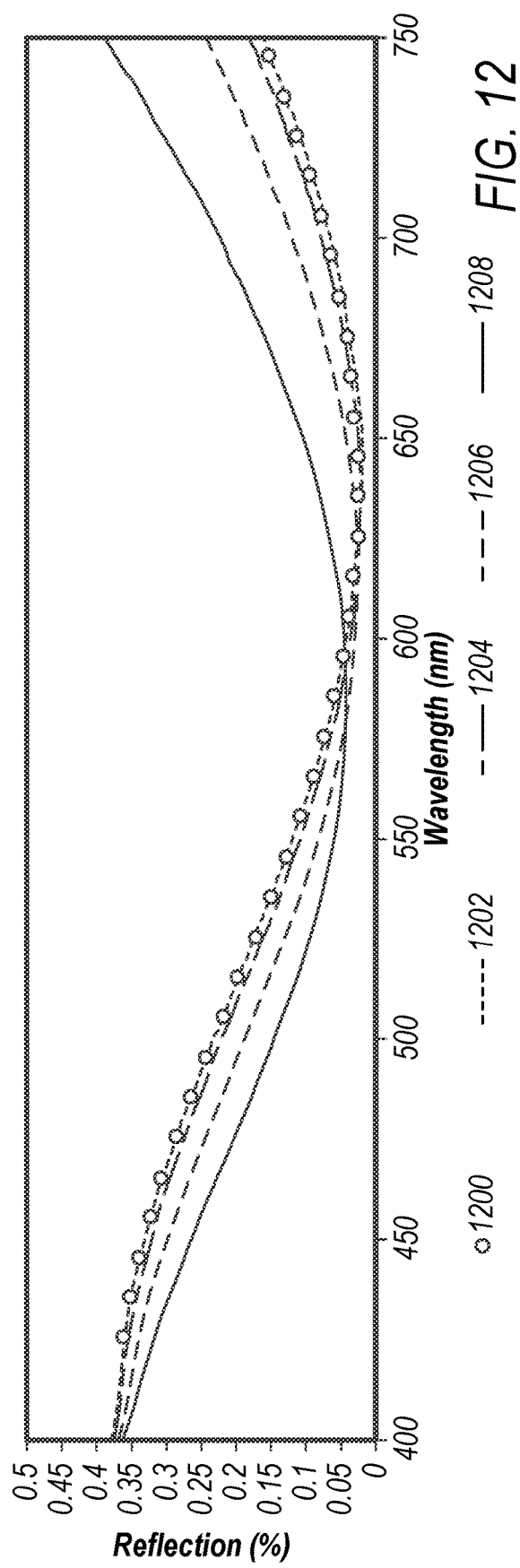
FIG. 12 depicts spectral performance for the embodiment depicted in FIG. 10 as determined by measurement and optical modeling.

FIGS. 11 and 12 depict optical modeling results for the embodiment of nanostructure 1002 depicted in FIG. 10. For the optical modeling, nanostructure 1002 was formed by depositing aluminum oxide with PVD and placing the structure in heated DI water for 30 minutes at a temperature of 70° C. FIG. 11 depicts optical modeling of refraction index versus physical thickness for the embodiment of nanostructure 1002 depicted in FIG. 10. As shown in FIG. 11, nanostructure 1002 has a refraction index that gradually changes from the substrate (shown by arrow 1100 on left of graph) to the incident medium (e.g., air) (shown by arrow 1102 on right of graph) where the nanostructure has a thickness of about 235 nm.

FIG. 12 depicts spectral performance for the embodiment of nanostructure 1002 depicted in FIG. 10 as determined by measurement and optical modeling. FIG. 12 depicts spectral performance measured at 0° angle of incidence for nanostructure 1002 along with spectral performance modeled for nanostructure 1002 at different angles of incidence. Spectral performance is shown by reflectance (in %) at different wavelengths between 400 nm and 750 nm. Curve 1200 (open dots) is a measurement of reflectance at 0° angle of incidence. Curves 1202, 1204, 1206, and 1208 are reflectance determined by modeling at different angles of incidence with curve 1202 at 0° angle of incidence, curve 1204 at 10° angle of incidence, curve 1206 at 20° angle of incidence, and curve 1208 at 30° angle of incidence. As shown in FIG. 12, nanostructure 1002 may have a reflectance that averages at about 0.15% with variation in the reflectance between 400 nm and 700 nm.

While nanostructure 1002 has improved spectral performance properties over PVD and ALD deposited films (shown by the curves in FIGS. 2, 7, and 8), as shown by the curve in FIG. 11, using only nanostructure 1002 on a substrate may not allow for tuning of the refraction index. For example, the refraction index may not be varied outside the range set by the nanostructure (e.g., the limits shown by the curve in FIG. 11), though the range set by the nanostructure can be varied. Further, as shown by the curves in FIG. 12, nanostructure 1002 may have some variation in the spectral performance in the wavelength range between 400 nm and 700 nm. The spectral performance may also be affected by the thickness of nanostructure 1002. For example, reduced thicknesses may shift the low point of reflectance to lower wavelengths and generate a more v-like shape in the spectral performance curve. Increased thicknesses may shift the low point of reflectance to higher wavelengths and also affect the shape of the spectral performance curve.

Figure 13:
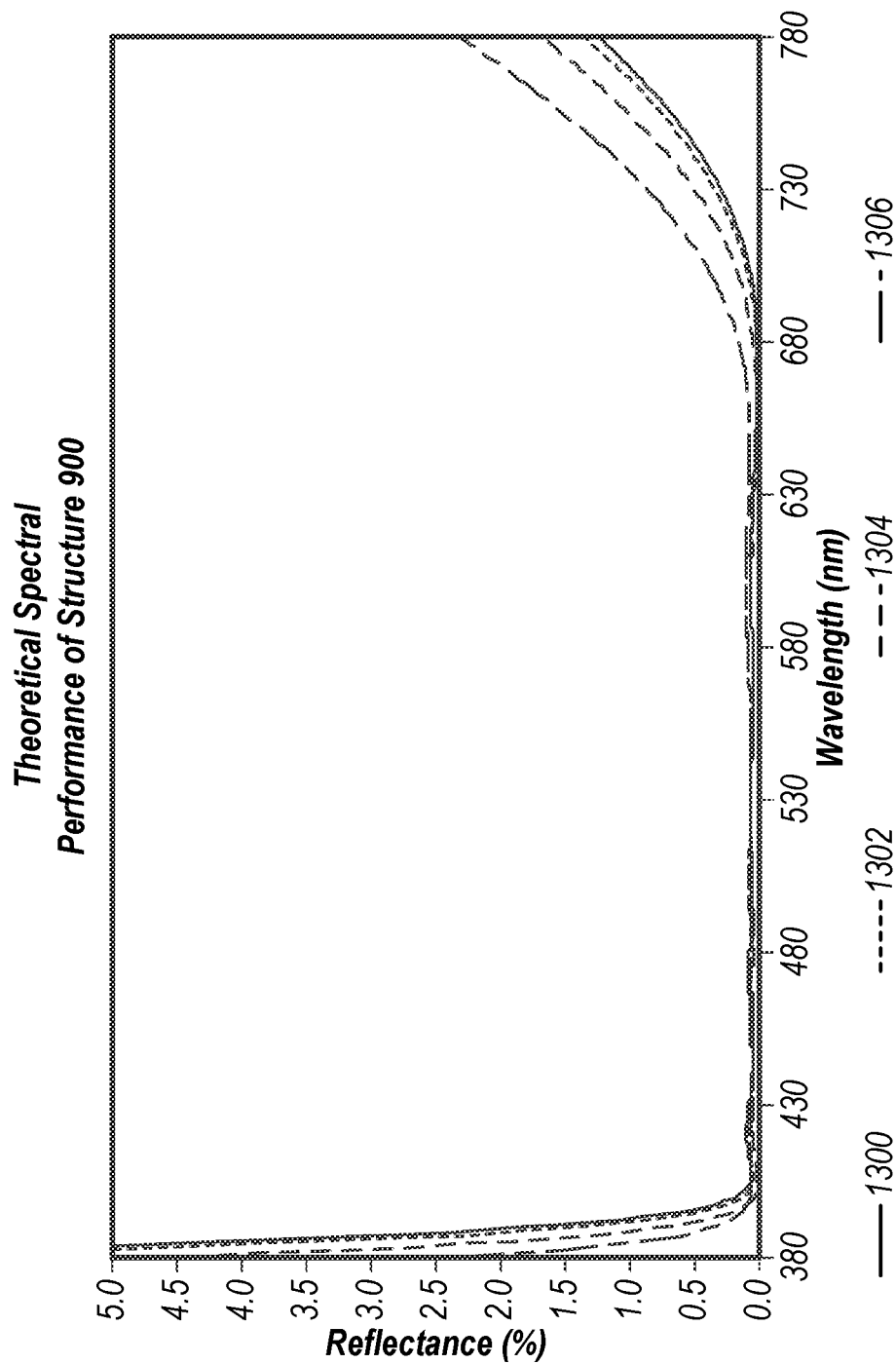
FIG. 13 depicts spectral performance determined by theoretical modeling for an embodiment of an AR coating.
Figure 14:
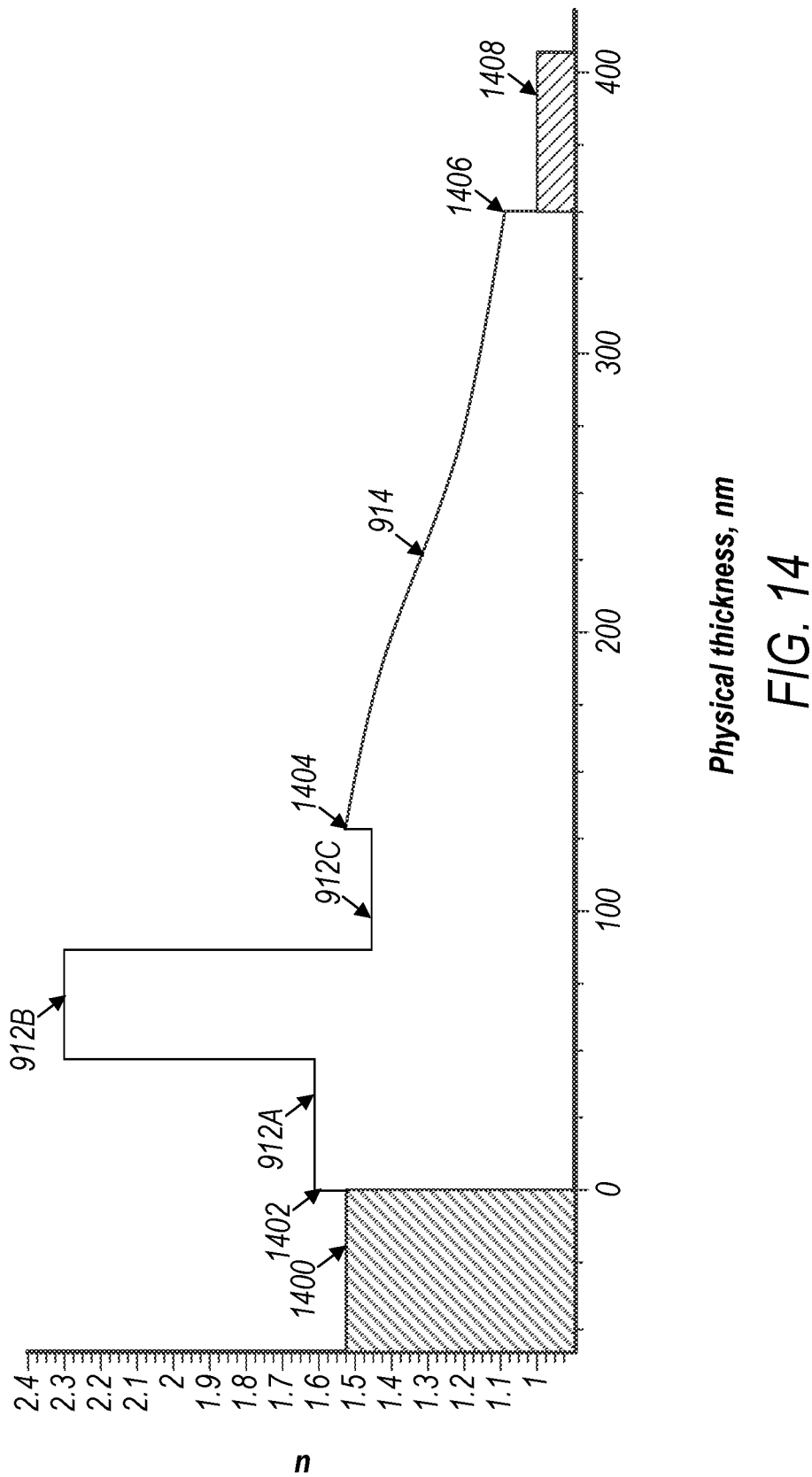
FIG. 14 depicts the index of refraction versus thickness determined by theoretical modeling for an embodiment of an AR coating.

Returning to FIG. 9, forming nanostructure layer 914 on dielectric stack 912 and substrate 901 may, however, provide significant improvements in the spectral performance in comparison to embodiments that implement only either a nanostructure layer (e.g., nanostructure 1002) or a dielectric stack deposited by PEALD. FIGS. 13 and 14 depict theoretical (optical) modeling results for an example embodiment of AR coating 910 in structure 900 (shown in FIG. 9). For the theoretical modeling of AR coating 910 in FIGS. 10 and 11, dielectric stack 912 is a dielectric stack with three dielectric layers 912A, 912B, 912C where dielectric layer 912A is aluminum oxide, dielectric layer 912B is titanium oxide, and dielectric layer 912C is silicon dioxide. Nanostructure layer 914 is an aluminum oxide nanostructure formed by depositing a layer of aluminum oxide with a thickness around 40 nm using PEALD and placing the structure with the PEALD-deposited aluminum oxide in heated DI water at a temperature of about 70° C. for about 30 minutes. After the heated DI water treatment, the thickness of nanostructure layer 914 is about 220 nm.

FIG. 13 depicts spectral performance determined by theoretical modeling for the above-described embodiment of AR coating 910. The spectral performance depicted in FIG. 13 includes spectral performance modeled at different angles of incidence and shown by reflectance (in %) at different wavelengths between 380 nm and 780 nm. Curve 1300 is reflectance modeled at 0° angle of incidence. Curve 1302 is reflectance modeled at 10° angle of incidence. Curve 1304 is reflectance modeled at 20° angle of incidence. Curve 1306 is reflectance modeled at 30° angle of incidence.

As shown in FIG. 13, AR coating 910 may have a theoretical reflectance that averages at most about 0.05% at wavelengths between 400 nm and 700 nm. Such spectral performance may be beyond what might be expected based on the individual spectral performances of a nanostructure layer (as shown in FIG. 12) and an ALD-deposited dielectric stack (as shown in FIGS. 7 and 8). For example, the theoretical average reflectance for AR coating 910, shown in FIG. 13, is lower than the average reflectance individually of either a nanostructure layer or an ALD-deposited dielectric stack. Additionally, the angular dependence of the spectral performance for AR coating 910 is reduced versus the angular dependence of the spectral performance individually of either a nanostructure layer or an ALD-deposited dielectric stack. For example, at wavelengths between about 400 nm and about 700 nm, there is little to no angular shift in the spectral performance of AR coating 910 (e.g., little to no change in spectral performance based on the angle of incidence). As described herein, AR coating 910 may provide high antireflection performance across a wide range of incidence angles for substrate 901 (e.g., a curved or non-planar polymeric substrate).

FIG. 14 depicts the index of refraction versus thickness determined by theoretical modeling for the above-described embodiment of AR coating 910. The index of refraction for the substrate (e.g., a polymeric substrate) is shown in section 1400. The index of refraction changes at point 1402 to dielectric layer 912A (e.g., aluminum oxide) in the PEALD-deposited layers (e.g., dielectric stack 912). The index of refraction then changes again in dielectric layer 912B (e.g., titanium oxide) and dielectric layer 912C (silicon dioxide). The changes in the index of refraction in dielectric stack 912 is abrupt, as shown in FIG. 14, and the changes allow for tuning of the index of refraction in the dielectric stack. For example, by changing materials, thicknesses, and/or number of layers in dielectric stack 912.

The index of refraction gradually changes in nanostructure layer 914 between point 1404 and point 1406. The gradual change of the index of refraction in nanostructure layer 914 is similar to the gradual change shown of the index of refraction shown in FIG. 11. The index of refraction then changes to the index of refraction for the incident medium (e.g., air) in section 1408 at point 1406. As shown by the curves in FIGS. 13 and 14, AR coating 910 has an index of refraction that may be tuned within dielectric stack 912 (e.g., dielectric layers 912A, 912B, 912C) and then gradually changed in nanostructure layer 914 for substrate 901 (e.g., a curved or non-planar polymeric substrate) where the index of refraction also has little to no angular shift across a wide range of incidence.

Figure 15:
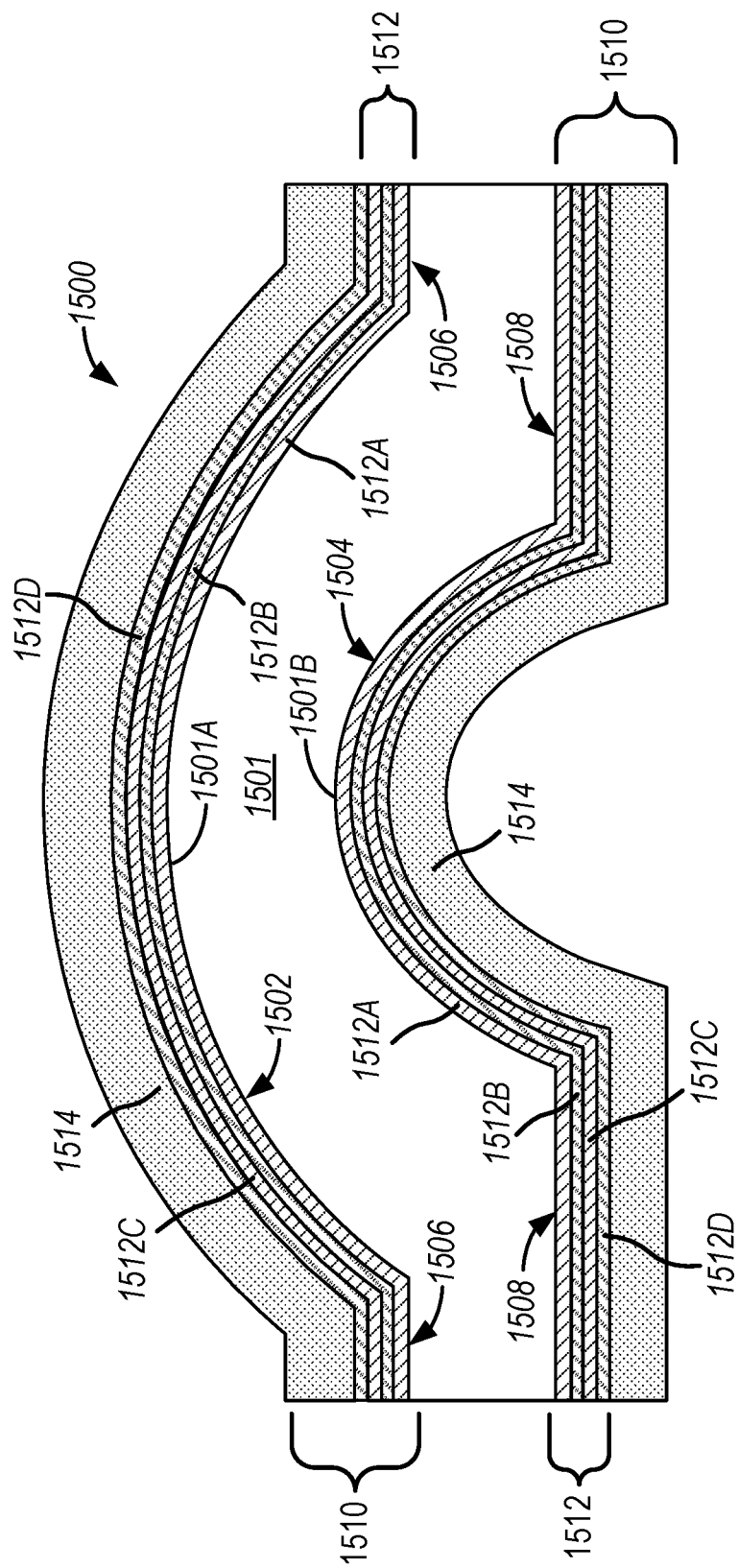
FIG. 15 depicts a cross-sectional representation of a structure having an absorbing coating formed on a non-planar substrate, according to some embodiments.

FIG. 15 depicts a cross-sectional representation of a structure having an absorbing coating formed on a non-planar substrate, according to some embodiments. Structure 1500 includes substrate 1501. In certain embodiments, substrate 1501 is a metal substrate (e.g., a stainless steel substrate). For example, substrate 1501 may be a surface located in a camera or other optical device. Substrate 1501 may be, for example, a surface with reflective properties, which need to be inhibited in the camera or optical device. In certain embodiments, substrate 1501 includes one or more non-planar features. For example, substrate 1501 may include angle changes, height changes, three-dimensional structures, etc.

In the depicted embodiment, substrate 1501 includes a curved, non-planar structure (e.g., the structure is non-planar such that a portion of the surface of the substrate is non-flat). As used herein, a curved, non-planar structure includes a structure that causes a surface of a substrate to be non-flat or non-planar. The angles and/or shapes of the non-planar structure may vary. For example, structures may be contemplated with curved angles, rectangular angles, or combinations thereof.

In certain embodiments, as shown in FIG. 15, substrate 1501 has two curved, non-planar structures, curved upper structure 1502 on upper surface 1501A of the substrate and curved lower structure 1504 on lower surface 1501B of the substrate. In some embodiments, substrate 1501 may include a surface that has one or more curved, non-planar structures in combination with one or more flat portions along the surface. For example, as shown in the depicted embodiment, upper surface 1501A of substrate 1501 includes curved upper structure 1502 along with two small, flat portions 1506 and lower surface 1501B includes curved lower structure 1504 along with two flat portions 1508. For embodiments with multiple structures on the surface of a substrate, the angles or shapes in the multiple structures on the surface may be the same for each structure or may vary between the structures.

In certain embodiments, absorbing (e.g., "black" optical) coating 1510 is formed on substrate 1501. As shown in FIG. 15, absorbing coating 1510 is formed on both upper surface 1501A and lower surface 1501B of substrate 1501. Other embodiments may be contemplated where absorbing coating 1510 is formed on only upper surface 1501A or on only lower surface 1501B.

In the depicted embodiment, absorbing coating 1510 includes stack 1512 and nanostructure layer 1514 formed on substrate 1501. In certain embodiments, stack 1512 includes one or more absorbing material layers in combination with one or more transparent material layers. Absorbing material utilized for the absorbing material layers in stack 1512 may include, but not be limited to, titanium-based materials, tantalum-based materials, and silicon-based materials. Examples of these dielectric materials include, but are not limited to, silicon hydride (SiH), titanium nitride (TiN), and titanium aluminum nitride (TiAlN). Transparent material utilized for the transparent material layers in stack 1512 may include, but not be limited to, silicon oxides and transition metal oxides. Examples of these transparent materials include, but are not limited to, titanium dioxide ($TiO_2$), aluminum oxide ($Al_2O_3$), and silicon dioxide ($SiO_2$).

In certain embodiments, the absorbing material layers and the transparent material layers are formed using a plasma-enhanced atomic layer deposition (PEALD) process, as described herein. An individual absorbing material or transparent material layer may be formed according to a PEALD process for the individual material in the layer. In certain embodiments, absorbing material layers are alternated with transparent material layers in stack 1512. Thus, the alternating layers include layers that alternate between a high index of refraction material (e.g., an absorbing material) and a low index of refraction material (e.g., a transparent material) to form an interference coating in stack 1512. For absorbing coating 1510, the absorbing properties of the high refractive index materials (e.g., the absorbing material layers) may determine the spectral performance of stack 1512.

In one embodiment, as shown in FIG. 15, stack 1512 includes four layers of material (e.g., layers 1512A, 1512B, 1512C, 1512D). In certain embodiments, layer 1512A is an adhesion layer for stack 1512. For example, layer 1512A may be an aluminum oxide, a titanium dioxide, or a titanium nitride adhesion layer. The adhesion layer may be used to provide adhesion to substrate 1501 that maintains adhesion between stack 1512 and the substrate under typical operating conditions (e.g., typical operating temperatures).

In some embodiments, layers 1512B, 1512C, 1512D are alternating material layers formed on layer 1512A (e.g., the adhesion layer). In such embodiments, layer 1512B may include a low refraction index dielectric material, layer 1512C may include a high refraction index material, and layer 1512D may include a low refraction index dielectric material. Thus, stack 1512 may include layer 1512A (which is titanium nitride and a high refraction index material), layer 1512B (which is a low refraction index material such as silicon dioxide), layer 1512C (which is a high refraction index material such as titanium nitride), and layer 1512D (which is a low refraction index material such as silicon dioxide), with the four layers forming an interference coating.

While four layers (e.g., layers 1512A, 1512B, 1512C, 1512D) are shown in the embodiment depicted in FIG. 15, stack 1512 may include any number of layers that provide desired optical and/or mechanical properties for absorbing coating 1510. For example, in one embodiment, stack 1512 may include a single layer of transparent material in addition to the adhesion layer, which is an absorbing material (such as a single layer of silicon dioxide on a titanium nitride adhesion layer). Examples of stack 1512 having larger numbers of layers are shown in the plots of index of refraction versus thickness shown in FIGS. 19 and 21. Reducing the number of layers in stack 1512 may improve the throughput of a process for forming absorbing coating 1510 (e.g., by reducing total process time needed by reducing number of layer depositions) while increasing the number of layers in stack 1512 may improve tuneability of the absorbing coating. In some embodiments, the number of layers in stack 1512 is varied to provide a desired spectral performance from absorbing coating 1510. The materials in the alternating absorbing and transparent layers may also be varied to provide variances in indices of refraction in the layers and produce desired spectral performance from absorbing coating 1510.

In some embodiments, stack 1512 may have a thickness between about 100 nm and about 1000 nm. The thickness of stack 1512 may vary based on the number of layers, types of absorbing or transparent materials, and desired optical or mechanical properties of the stack. For example, smaller thicknesses may be contemplated with stack 1512 only having one or two dielectric layers.

In the embodiment shown in FIG. 15, absorbing coating 1510 includes nanostructure layer 1514 formed on stack 1512. In certain embodiments, nanostructure layer 1514 is a nanostructure of aluminum oxide. In some embodiments, nanostructure layer 1514 is similar in properties to nanostructure layer 914, shown in FIG. 9. For example, as described herein, nanostructure layer 1514 may include a nanostructure of aluminum oxide formed by depositing a layer of aluminum oxide (e.g., using PEALD) on stack 1512 and placing the structure in heated deionized (DI) water for a predetermined time period. Placing the structure in heated DI water for the predetermined time period restructures the PEALD-deposited aluminum oxide to a nanostructure lattice of aluminum oxide (e.g., an aluminum oxide nanostructure).

Depositing the layer of aluminum oxide with PEALD may form the layer conformally on stack 1512 and substrate 1501. With the conformal deposition of the PEALD-deposited aluminum oxide on stack 1512 and substrate 1501, nanostructure layer 1514 may also be conformal on the stack and substrate. In some embodiments, stack 1512 includes a top layer of silicon dioxide. Silicon dioxide may be used in the top layer of stack 1512 to provide adhesion between the stack and nanostructure layer 1514 as silicon dioxide and PEALD-deposited aluminum oxide have good adhesion properties with respect to each other. The top layer of silicon dioxide may be layer 1512D, shown in FIG. 15, or another thin layer of silicon dioxide deposited on top of layer 1512D.

In certain embodiments, similar to nanostructure layer 914, nanostructure layer 1514 includes a mixture of aluminum oxide, aluminum hydroxide, and aluminum oxide hydroxide crystalline polymorphs (e.g., a mixture of Boehmite, Gibbsite, and Bayerite). As described above, the relative amounts of crystalline polymorphs along with the relative amount of aluminum oxide may vary depending on the structure of the aluminum oxide layer prior to treatment in heated DI water as well as the treatment parameters. Treatment parameters in the heated DI water may also be varied to vary the amount of restructuring to different crystalline polymorphs (e.g., Boehmite, Gibbsite, and Bayerite) that occurs in the PEALD-deposited aluminum oxide.

Figure 18:
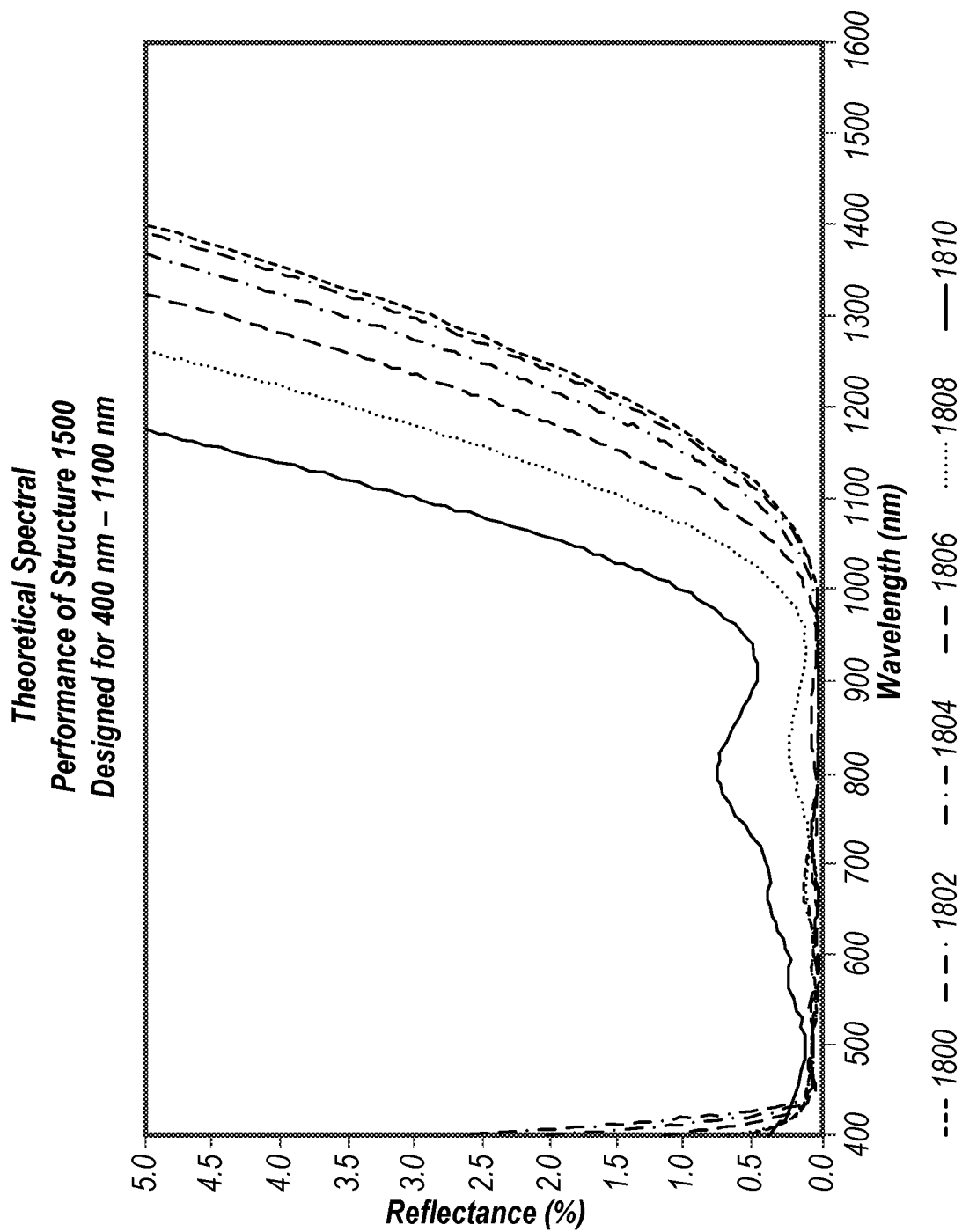
FIG. 18 depicts spectral performance determined by theoretical modeling for an embodiment of an absorbing coating designed for a wavelength range of 400 nm to 1100 nm.
Figure 19:
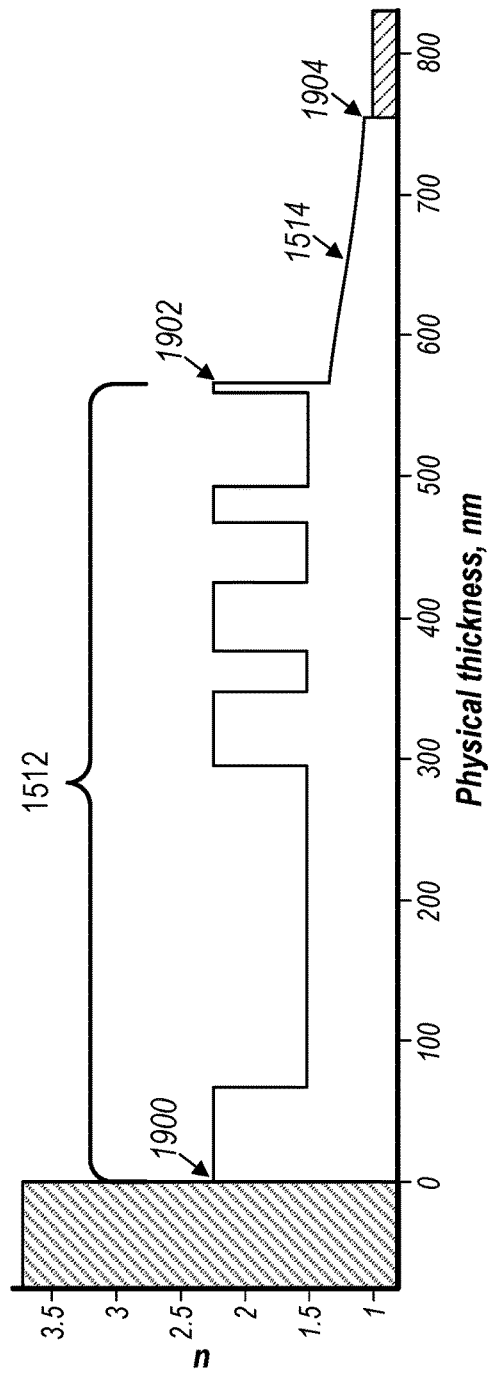
FIG. 19 depicts the index of refraction versus thickness determined by theoretical modeling for an embodiment of an absorbing coating designed for a wavelength range of 400 nm to 1100 nm.
Figure 21:
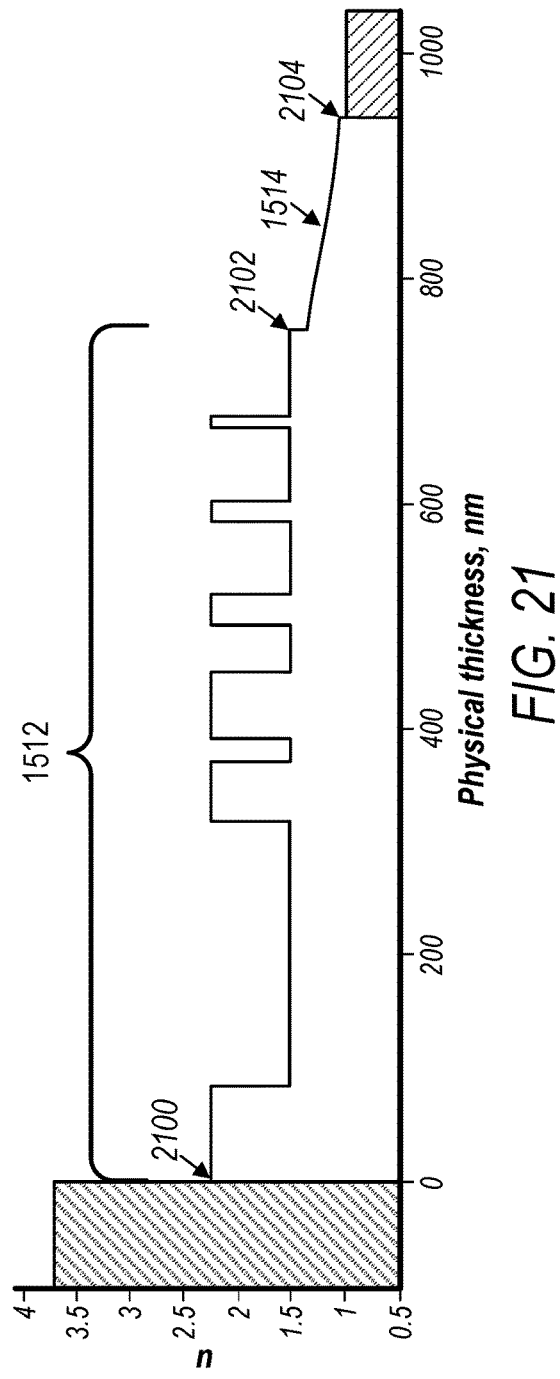
FIG. 21 depicts the index of refraction versus thickness determined by theoretical modeling for an embodiment of an absorbing coating designed for a wavelength range of 400 nm to 1600 nm.
Figure 20:
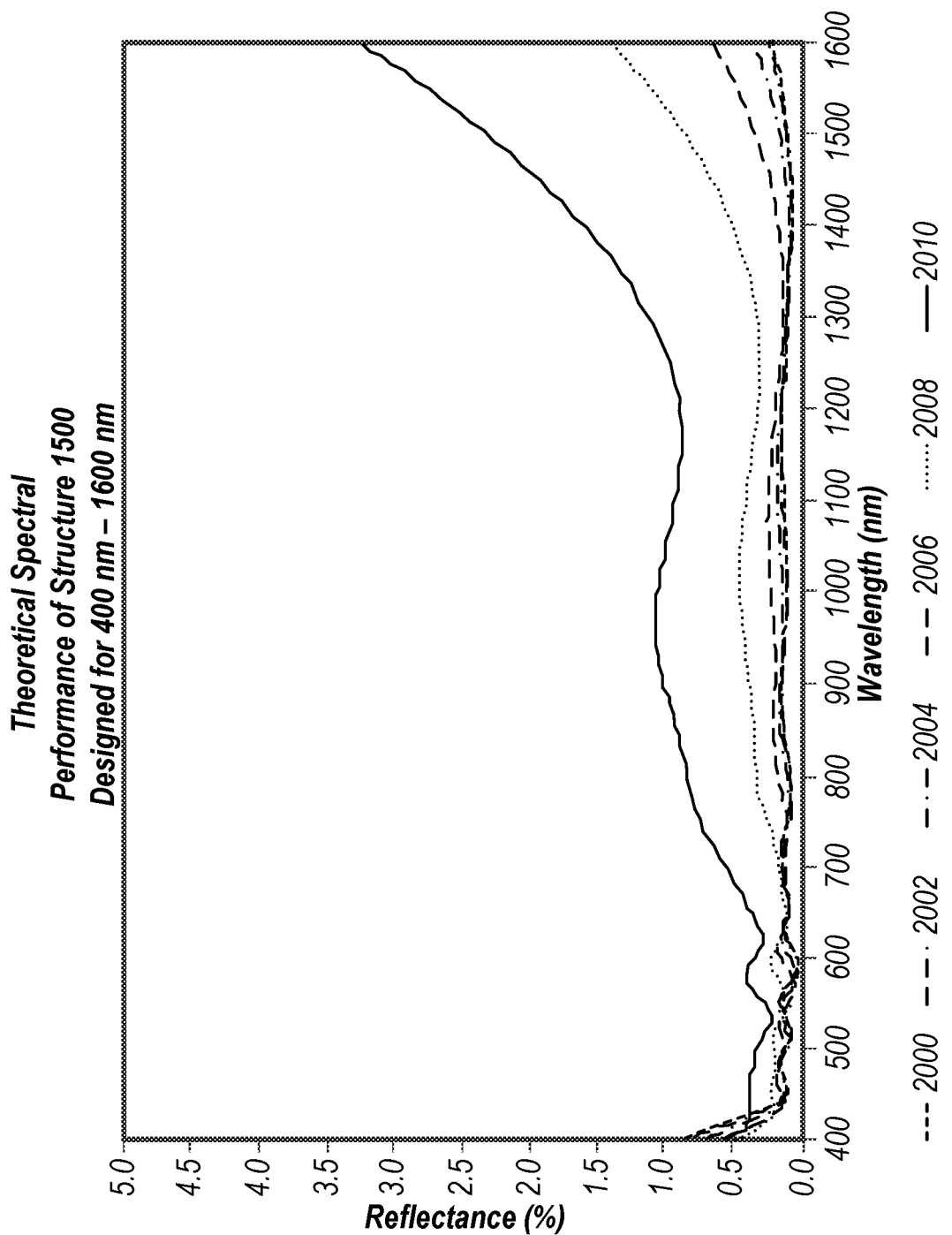
FIG. 20 depicts spectral performance determined by theoretical modeling for an embodiment of an absorbing coating designed for a wavelength range of 400 nm to 1600 nm.

In certain embodiments, nanostructure layer 1514 has a thickness between about 160 nm and about 260 nm. In some embodiments, nanostructure layer 1514 has a thickness between about 170 nm and about 250 nm. In some embodiments, nanostructure layer 1514 has a thickness between about 180 nm and about 240 nm. Other embodiments of thicknesses for nanostructure layer 1514 may also be contemplated, as described for nanostructure layer 914 above. The thickness of nanostructure layer 1514 may be varied to tune the spectral performance (and other properties) of absorbing coating 1510 in structure 1500. For example, thinner thicknesses may be used to shift the spectral performance to lower wavelengths (e.g., wavelengths in the visible range, as shown in FIGS. 18 and 19) while thicker thicknesses may be used to shift spectral performance to higher wavelengths (e.g., wavelengths in the near-IR range, as shown in FIGS. 20 and 21). As described herein, the thickness of nanostructure layer 1514 may be determined by the thickness of the PEALD-deposited aluminum oxide layer (e.g., aluminum oxide layer 2400, shown in FIGS. 24 and 25) prior to being treated in heated DI water.

Figure 17:
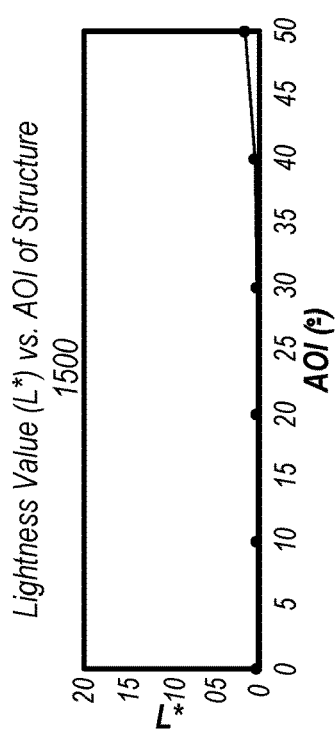
FIG. 17 depicts a plot of lightness value theoretically determined versus angle of incidence for an embodiment of an absorbing coating.
Figure 16:
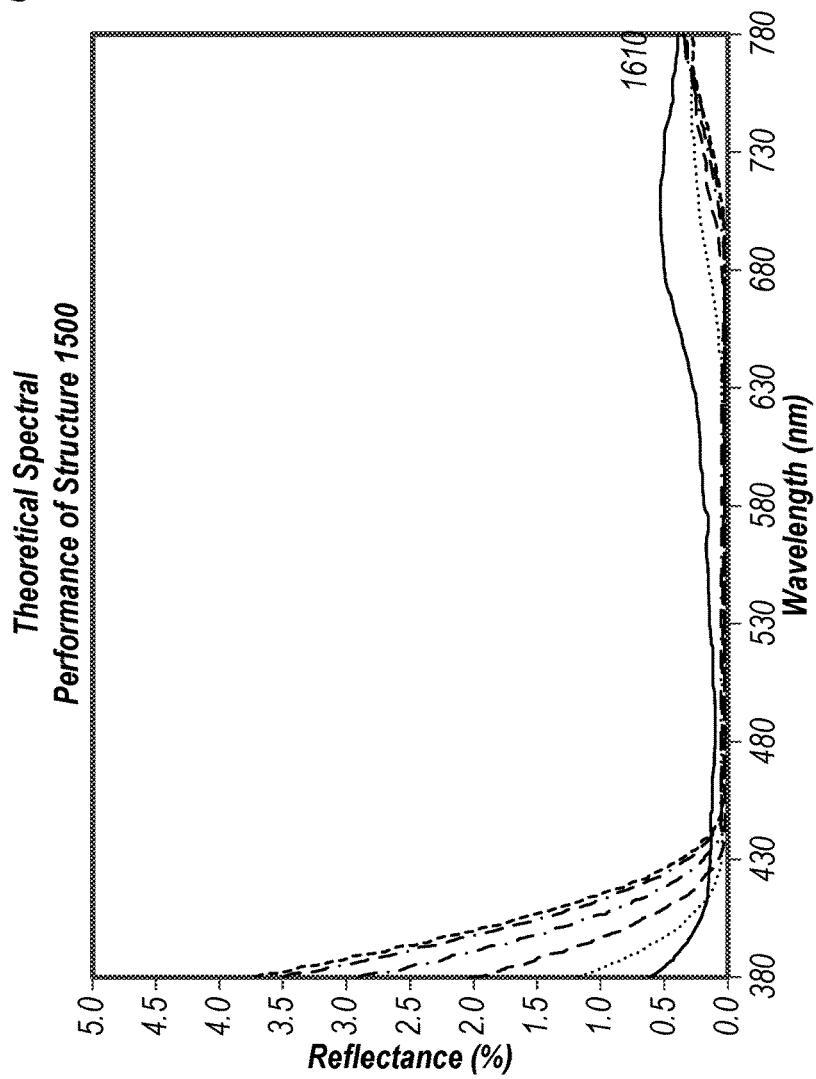
FIG. 16 depicts spectral performance determined by theoretical modeling for an embodiment of an absorbing coating.

Forming nanostructure layer 1514 on stack 1512 and substrate 1501 may provide improvements in the absorbance properties of absorbing coating 1510 as compared to absorbance properties of a stack of alternating layers of absorbing and transparent materials deposited by PEALD without the nanostructure layer (e.g., the properties of absorbing coating 300, shown in FIGS. 3-5). FIGS. 16 and 17 depict theoretical (optical) modeling results for an example embodiment of absorbing coating 1510 in structure 1500 (shown in FIG. 15).

FIG. 16 depicts spectral performance determined by theoretical modeling for the above-described embodiment of absorbing coating 1510. The spectral performance depicted in FIG. 16 includes spectral performance modeled at different angles of incidence and shown by reflectance (in %) at different wavelengths between 380 nm and 780 nm. Curve 1600 is reflectance modeled at 0° angle of incidence. Curve 1602 is reflectance modeled at 10° angle of incidence. Curve 1604 is reflectance modeled at 20° angle of incidence. Curve 1606 is reflectance modeled at 30° angle of incidence. Curve 1608 is reflectance modeled at 40° angle of incidence. Curve 1610 is reflectance modeled at 50° angle of incidence.

As shown in FIG. 16, absorbing coating 1510 may have a theoretical reflectance that averages at most about 0.05% at wavelengths between 400 nm and 780 nm over all angles of incidence. Additionally, the angular dependence of the spectral performance for absorbing coating 1510 is reduced versus the angular dependence of the spectral performance of a stack of alternating layers of absorbing and transparent materials deposited by PEALD without the nanostructure layer (shown in FIG. 4).

FIG. 17 depicts a plot of lightness value theoretically determined versus angle of incidence for an embodiment of absorbing coating 1510. As shown in FIG. 17, absorbing coating 1510 has a low lightness value over a wide range of angles of incidence. For example, absorbing coating 1510 has an average lightness value of less than about 0.3 over angles between about 0° and about 40° while the lightness value remains below about 0.5 at angles of incidence up to about 50°. Thus, the angular dependence of lightness value in absorbing coating 1510 is reduced versus the angular dependence of the lightness value of a stack of alternating layers of absorbing and transparent materials deposited by PEALD without the nanostructure layer (shown in FIG. 5). As described herein, absorbing coating 1510 may provide high absorbing performance across a wide range of incidence angles for substrate 1501 (e.g., a curved or non-planar substrate).

Absorbing coating 1510 may also be designed for implementation over different wavelength ranges. For example, absorbing coating 1510 may be designed for visible wavelength ranges and/or near-IR wavelength ranges depending on the utilization of the absorbing coating. Absorbing coating 1510 may be suitable for the different wavelength ranges based on the utilization of nanostructure layer 1514 in the absorbing coating. FIGS. 18 and 19 depict spectral performance and an index of refraction profile for an embodiment of absorbing coating 1510 designed for a wavelength range of 400 nm to 1100 nm.

FIG. 18 depicts spectral performance determined by theoretical modeling for the embodiment of absorbing coating 1510 designed for a wavelength range of 400 nm to 1100 nm. The spectral performance depicted in FIG. 18 includes spectral performance modeled at different angles of incidence and shown by reflectance (in %) at different wavelengths between 400 nm and 1600 nm. Curve 1800 is reflectance modeled at 0° angle of incidence. Curve 1802 is reflectance modeled at 10° angle of incidence. Curve 1804 is reflectance modeled at 20° angle of incidence. Curve 1806 is reflectance modeled at 30° angle of incidence. Curve 1808 is reflectance modeled at 40° angle of incidence. Curve 1810 is reflectance modeled at 50° angle of incidence.

As shown in FIG. 18, spectral performance is optimized for the wavelength range of about 400 nm to about 1100 nm. Additionally, there is minimal wavelength dependence and angular dependence of the spectral performance for absorbing coating 1510 over a range of angles of incidence between 0° and about 40°.

FIG. 19 depicts the index of refraction versus thickness determined by theoretical modeling for the embodiment of absorbing coating 1510 designed for a wavelength range of 400 nm to 1100 nm. As shown in FIG. 19, absorbing coating 1510 includes stack 1512 with a thickness of about 560 nm. Stack 1512 includes the alternating layers of transparent materials and absorbing materials (shown by alternating indices of refraction between 0 nm thickness (point 1900) and about 560 nm thickness (point 1902). Absorbing coating 1510 includes nanostructure layer 1514 above stack 1512 with a thickness of about 190 nm. Nanostructure layer 1514 includes a gradual change in refraction index between about 560 nm (point 1902) and about 750 nm (point 1904) in thickness in absorbing coating 1510. The index of refraction then transitions to air at about 750 nm (point 1904).

FIGS. 20 and 21 depict spectral performance and an index of refraction profile for an embodiment of absorbing coating 1510 designed for a wavelength range of 400 nm to 1600 nm. FIG. 20 depicts spectral performance determined by theoretical modeling for the embodiment of absorbing coating 1510 designed for a wavelength range of 400 nm to 1600 nm. The spectral performance depicted in FIG. 20 includes spectral performance modeled at different angles of incidence and shown by reflectance (in %) at different wavelengths between 400 nm and 1600 nm. Curve 2000 is reflectance modeled at 0° angle of incidence. Curve 2002 is reflectance modeled at 10° angle of incidence. Curve 2004 is reflectance modeled at 20° angle of incidence. Curve 2006 is reflectance modeled at 30° angle of incidence. Curve 2008 is reflectance modeled at 40° angle of incidence. Curve 2010 is reflectance modeled at 50° angle of incidence.

As shown in FIG. 20, spectral performance is optimized for the wavelength range of about 400 nm to about 1600 nm. Additionally, there is minimal wavelength dependence and angular dependence of the spectral performance for absorbing coating 1510 over a range of angles of incidence between 0° and about 40°.

FIG. 21 depicts the index of refraction versus thickness determined by theoretical modeling for the embodiment of absorbing coating 1510 designed for a wavelength range of 400 nm to 1600 nm. As shown in FIG. 20, absorbing coating 1510 includes stack 1512 with a thickness of about 750 nm. Stack 1512 includes the alternating layers of transparent materials and absorbing materials (shown by alternating indices of refraction between 0 nm thickness (point 2100) and about 750 nm thickness (point 2102). Absorbing coating 1510 includes nanostructure layer 1514 above stack 1512 with a thickness of about 190 nm. Nanostructure layer 1514 includes a gradual change in refraction index between about 750 nm (point 2102) and about 940 nm (point 2104) in thickness in absorbing coating 1510. The index of refraction then transitions to air at about 940 nm (point 2104). As shown in FIGS. 18-21, stack 512 may be tuned (e.g., by varying the number of layers in the stack and/or the indices of refraction in the stack) to provide absorbing properties that are designed for operation over varying wavelength ranges.

Example Method for Optical Coatings

Figure 22:
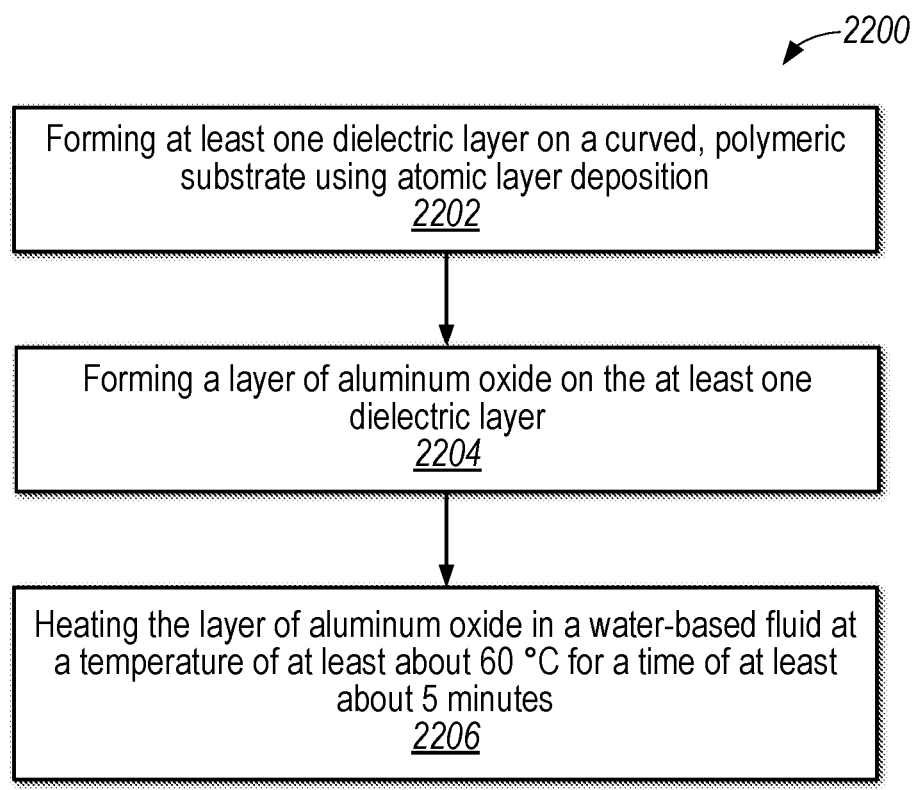
FIG. 22 is a flow diagram illustrating a method for forming an AR coating on a substrate, according to some embodiments.

FIG. 22 is a flow diagram illustrating method 2200 for forming AR coating 910 on substrate 901, according to some embodiments. While method 2200 is described for an AR coating, it is to be understood that method 2200 may implement for any optical coating described herein based on changing materials of deposition. For example, method 2200 may be implemented to form absorbing coating 1510 on substrate 1501 by forming transparent and absorbing material layers using PEALD on a curved or non-planar substrate in lieu of forming dielectric layers on a curved, polymeric substrate, as described for method 2200, while forming the nanostructure from a layer of aluminum oxide remains substantially the same in the described method.

Figure 23:
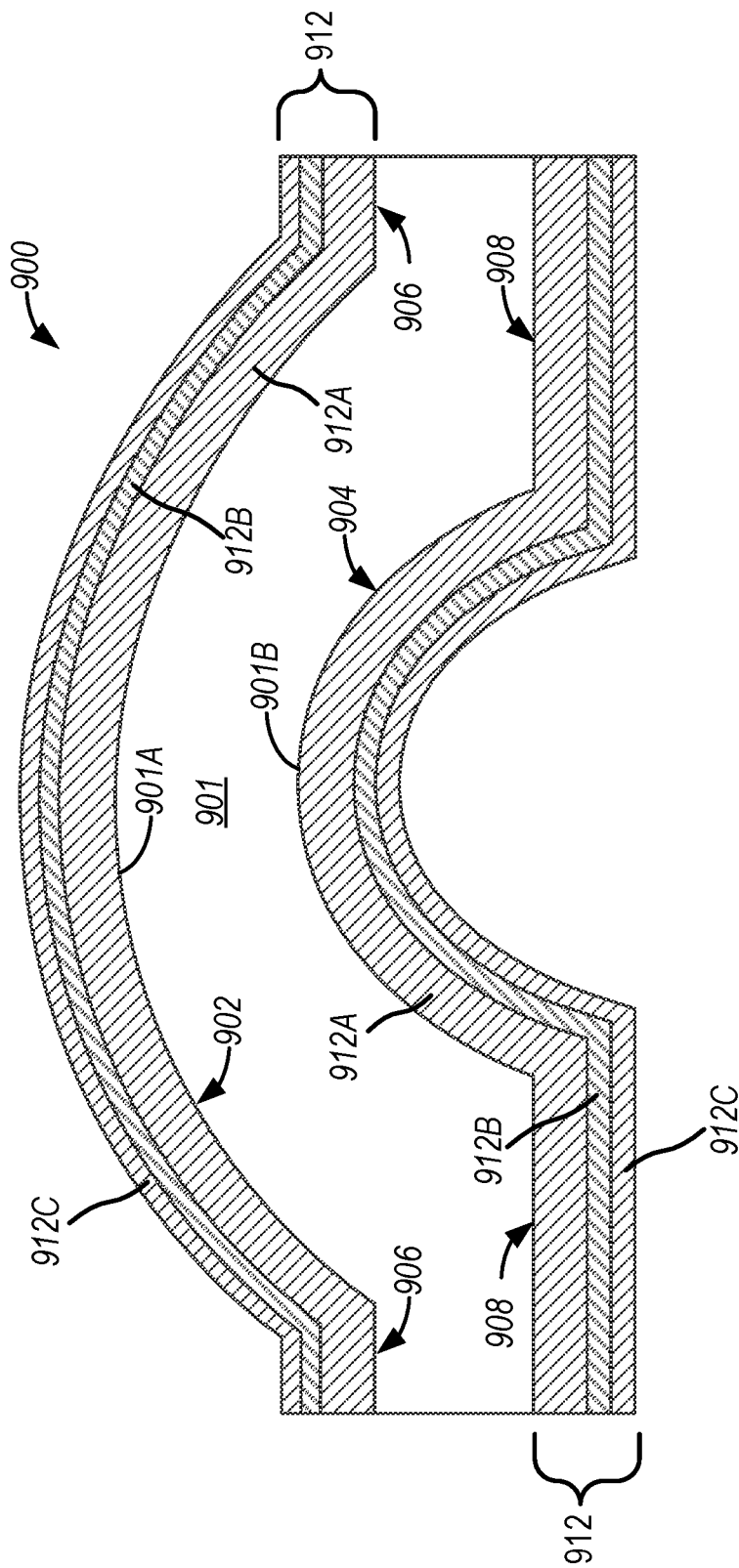
FIG. 23 depicts a cross-sectional representation of at least one dielectric layer formed on a substrate using atomic layer deposition, according to some embodiments.

As shown in FIG. 22, at 2202, in the illustrated embodiment, at least one dielectric layer is formed on substrate 901 using atomic layer deposition. FIG. 23 depicts a cross-sectional representation of at least one dielectric layer formed on substrate 901 using atomic layer deposition, according to some embodiments. As shown in FIG. 23, dielectric stack 912, which includes dielectric layers 912A, 912B, and 912C is formed on substrate 901 in structure 900. In certain embodiments, dielectric layers 912A, 912B, and 912C are formed using PEALD (plasma-enhanced atomic layer deposition). Dielectric layers 912A, 912B, and 912C may be formed using different PEALD processes for each of the dielectric layers. The different PEALD processes may be carried out in a single process chamber or single process flow. Using PEALD, dielectric layers 912A, 912B, and 912C may be conformal on substrate 901 (e.g., the dielectric layers conform to the curvature of the substrate and are deposited with substantially uniform thickness across the substrate surfaces).

In certain embodiments, the processing temperature is a temperature for the PEALD processes is below the glass transition temperature of substrate 901. For example, the PEALD processes may have processing temperatures of at most about 90° C. The processing temperatures may vary based on the desired dielectric material and the substrate material being implemented.

Figure 24:
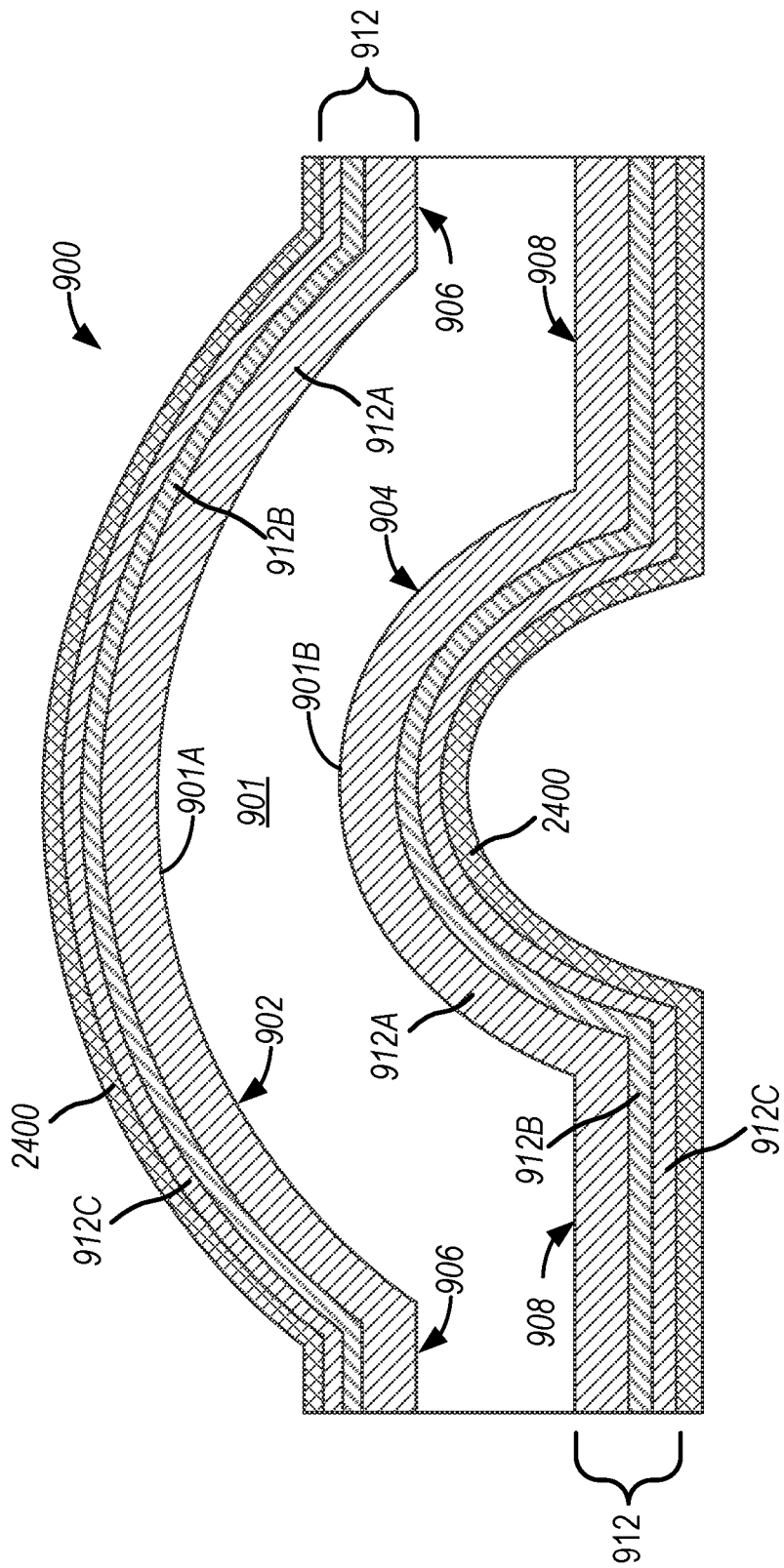
FIG. 24 depicts a cross-sectional representation of an aluminum oxide layer formed on a dielectric stack in a structure, according to some embodiments.

Returning to FIG. 22, after dielectric stack 912 (e.g., the at least one dielectric layer) is formed on substrate 901, at 2204, in the illustrated embodiment, a layer of aluminum oxide is formed on the at least one dielectric layer (dielectric stack 912). FIG. 24 depicts a cross-sectional representation of aluminum oxide layer 2400 formed on dielectric stack 912 in structure 900, according to some embodiments. In certain embodiments, aluminum oxide layer 2400 is formed on dielectric stack 912 using atomic layer deposition (e.g., PEALD). In some embodiments, PEALD of aluminum oxide layer 2400 is carried out in the same process chamber or same process flow as used to form dielectric stack 912. Using atomic layer deposition, aluminum oxide layer 2400 may be conformally formed on dielectric stack 912 with substantially uniform thickness. The thickness of aluminum oxide layer 2400 may vary between, for example, about 30 nm and about 55 nm. As described above, a uniform thickness of aluminum oxide layer 2400 may inhibit undesirable increases in non-uniformity and reductions in spectral performance of nanostructure layer 914 formed during subsequent processing of the aluminum oxide layer (described below).

Figure 25:
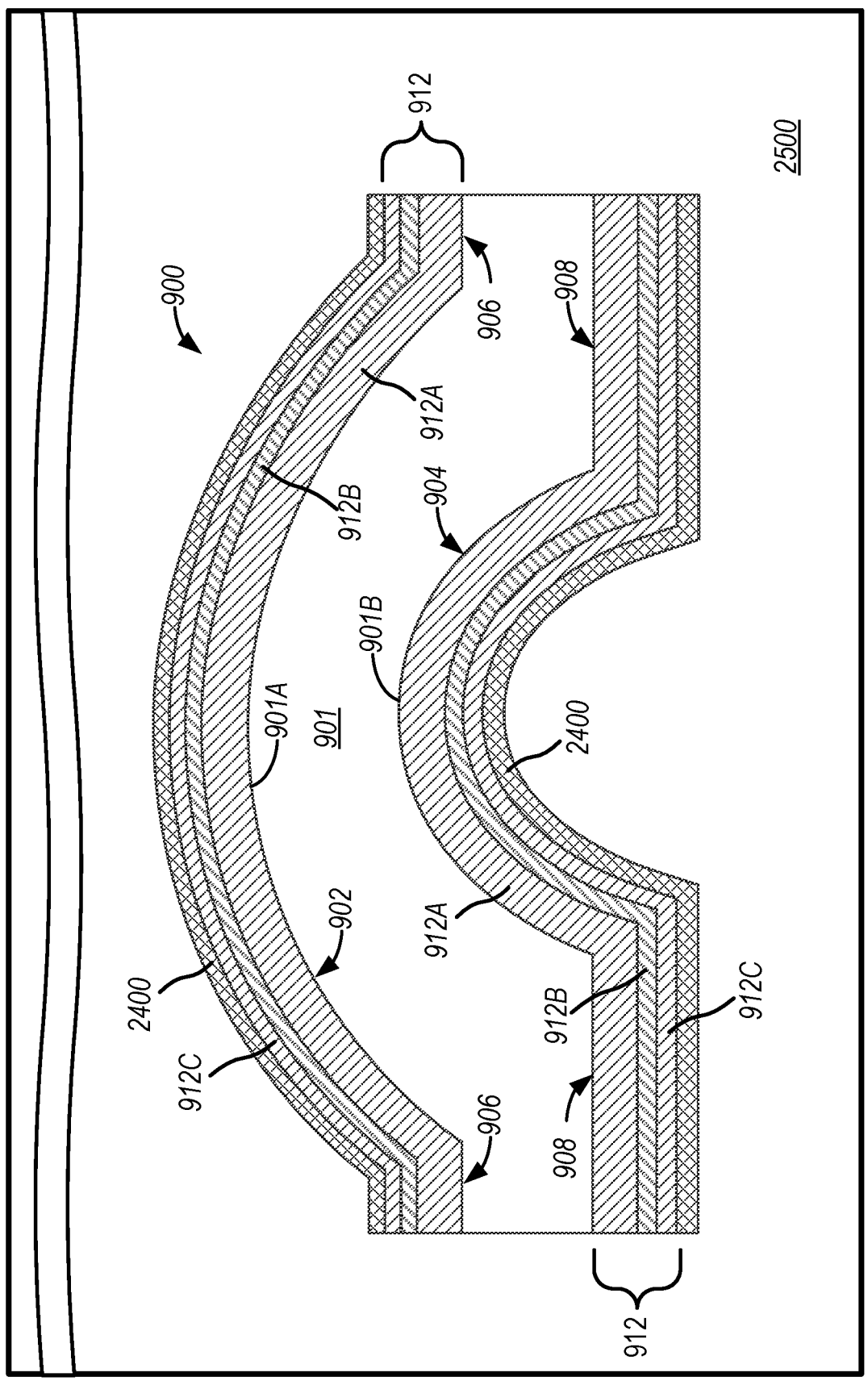
FIG. 25 depicts a cross-sectional representation of an aluminum oxide layer formed on a dielectric stack in a structure being heated in a water-based fluid, according to some embodiments.

Returning to FIG. 22, after aluminum oxide layer 2400 is formed on dielectric stack 912 and substrate 901, at 2206, in the illustrated embodiment, the aluminum oxide layer is heated in a water-based fluid at a temperature of at least about 50° C. for a time of at least about 5 minutes. FIG. 25 depicts a cross-sectional representation of aluminum oxide layer 2400 formed on dielectric stack 912 in structure 900 being heated in water-based fluid 2500, according to some embodiments. Aluminum oxide layer 2400 may be heated by placing structure 900 in water-based fluid 2500 for a predetermined period of time to transform aluminum oxide layer 2400 into nanostructure layer 914 (shown in FIG. 9).

In certain embodiments, water-based fluid 2500 is deionized (DI) water. Embodiments may also be contemplated where water-based fluid 2500 includes additional additives (e.g., surfactants, reaction inhibitors, reaction accelerators, etc.). In certain embodiments, water-based fluid 2500 (e.g., DI water) is at a temperature between about 50° C. and about 95° C. during heating of structure 900. In some embodiments, water-based fluid 2500 is at a temperature between about 60° C. and about 95° C. during heating of structure 900. In various embodiments, the time period for heating structure 900 in water-based fluid 2500 may be between about 5 minutes and about 60 minutes. Typically, the higher the temperature of water-based fluid 2500, the shorter duration of the time period for structure 900 to be placed in water-based fluid 2500. For example, as described above, in one embodiment, structure 900 is placed in water-based fluid 2500 at a temperature of about 70° C. for about 30 minutes. Increasing the temperature of water-based fluid 2500 may allow for a reduced time period (e.g., a temperature of about 95° C. for about 5 minutes). Lowering the temperature of water-based fluid 2500 may necessitate increasing the time period (e.g., a temperature of about 60° C. for about 60 minutes or a temperature of about 50° C. for about 90 minutes). The temperature and time period for placing structure 900 in water-based fluid 2500 may also be varied to provide different transformations (e.g., different crystalline polymorph transformations) in aluminum oxide layer 2400 to nanostructure layer 914.

Figure 27:
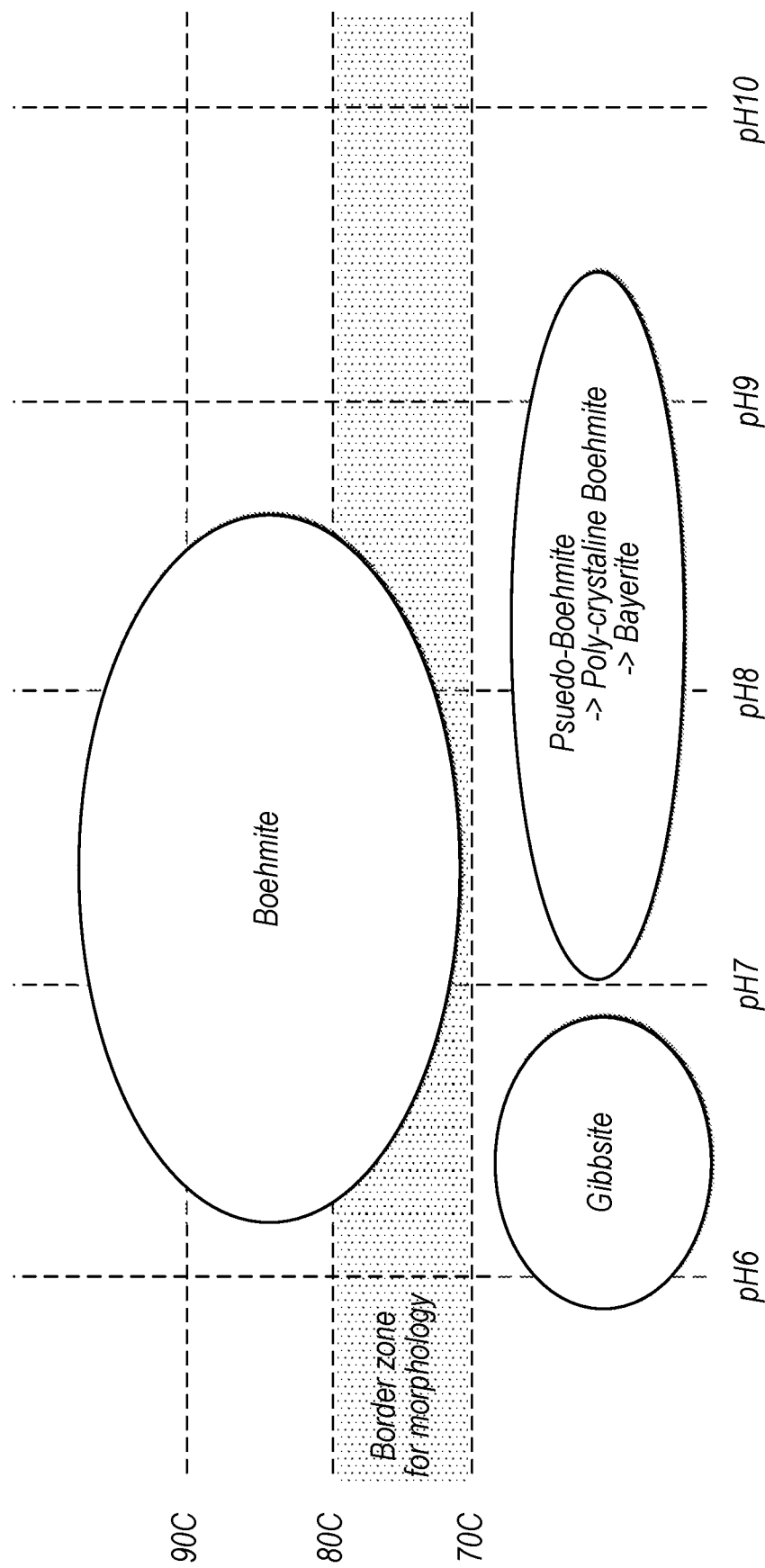
FIG. 27 depicts an example of temperature and pH ranges that may produce different crystalline polymorphs.

In some embodiments, the pH of water-based fluid 2500 (e.g., DI water) may have an effect on the different transformations (e.g., different crystalline polymorph transformations) in aluminum oxide layer 2400 to nanostructure layer 914. For instance, Gibbsite may be more likely to form than Bayerite at lower pH values (e.g., pH values below about 7) while Bayerite or other forms of Boehmite (such as pseudo-Boehmite or polycrystalline Boehmite) may be more likely to form at higher pH values (e.g., pH values above about 7). FIG. 27 depicts an example of temperature and pH ranges that may produce different crystalline polymorphs (Boehmite, Gibbsite, and Bayerite) in nanostructure layer 914 from treatment of aluminum oxide layer 2400. Based on the example of FIG. 27, it should be understood that varying the exposure of aluminum oxide layer 2400 to different temperatures and/or pH conditions may affect the formation of different crystalline structures in nanostructure layer 914.

As described above, nanostructure layer 914 is a "grass-like" or "flower-like" structure after aluminum oxide layer 2400 is placed in the heated DI water (an example of the "grass-like" or "flower-like" is shown by nanostructure 1002, shown in FIG. 10). Reaction of aluminum oxide layer 2400 with heated DI water also increases the thickness of nanostructure layer 914 compared to aluminum oxide layer 2400. For example, a 30 nm aluminum oxide layer 2400 may generate nanostructure layer 914 with a thickness of about 160 nm while a 55 nm aluminum oxide layer 2400 may generate nanostructure layer 914 with a thickness of about 240 nm.

Forming nanostructure layer 914 with the "grass-like" or "flower-like" structure may be dependent on conformal deposition (by PEALD) of aluminum oxide layer 2400. The conformal deposition of aluminum oxide layer 2400 may allow uniform reaction with DI water along the surface of the aluminum oxide layer. In addition, aluminum oxide layer 2400 deposited by PEALD may include impurities (e.g., structural impurities) that allow the aluminum oxide layer to chemically react with DI water. Impurities may include, but not be limited to, the presence of —OH groups, alkyl groups, and/or AlOH$_3$ groups in aluminum oxide layer 2400, as deposited by PEALD. Without these impurities (e.g., if aluminum oxide layer 2400 is pure crystalline), there may be little to no reaction between aluminum oxide layer 2400 and the heated DI water.

Numerous variations and modifications will become apparent to those skilled in the art once the above disclosure is fully appreciated. It is intended that the following claims be interpreted to embrace all such variations and modifications.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An antireflection optical device, comprising:
   a curved, polymeric substrate; and
   an antireflection coating formed on a surface of a curved portion of the curved, polymeric substrate, wherein the antireflection coating includes:
   at least one conformal dielectric layer formed on the curved portion of the substrate, wherein each conformal dielectric layer is formed by atomic layer deposition, and wherein the at least one conformal dielectric layer includes a first dielectric layer and a second dielectric layer, and wherein the first dielectric layer has a first index of refraction and the second dielectric layer has a second index of refraction, the first index of refraction being different than the second index of refraction; and
   an aluminum oxide nanostructure formed directly on a surface of the at least one conformal dielectric layer most distal from the substrate, wherein the aluminum oxide nanostructure includes a mixture of aluminum oxide, aluminum hydroxide, and aluminum oxide hydroxide.

2. The device of claim 1, wherein the antireflection coating has an average reflectance of at most about 0.05% in a wavelength range of 400 nm to 700 nm at an angle of incidence between 0° and 30° across the surface of the curved, polymeric substrate.

3. The device of claim 1, wherein the mixture of aluminum oxide, aluminum hydroxide, and aluminum oxide hydroxide includes a mixture of Boehmite, Gibbsite, and Bayerite.

4. The device of claim 1, wherein the mixture of aluminum oxide, aluminum hydroxide, and aluminum oxide hydroxide includes crystalline polymorphs of aluminum oxide, aluminum hydroxide, and aluminum oxide hydroxide.

5. The device of claim 4, wherein the crystalline polymorphs include orthorhombic, hexagonal, or monoclinic crystalline structures.

6. The device of claim 1, wherein the at least one conformal dielectric layer includes silicon dioxide.

7. The device of claim 1, wherein the first index of refraction has a difference of at least about 0.5 from the second index of refraction.

8. An antireflection optical device, comprising:
   a curved, polymeric substrate;
   at least one dielectric layer formed on a curved portion of the curved, polymeric substrate, wherein each dielectric layer is formed using atomic layer deposition;
   an adhesion layer between the at least one dielectric layer and the curved, polymeric substrate; and
   a nanostructure of aluminum oxide formed directly on a surface of the at least one dielectric layer furthest from the substrate, wherein the nanostructure is formed from a layer of aluminum oxide deposited on the at least one dielectric layer that is placed in a heated water-based fluid with a temperature of at least about 50° C. for a time of at least about 5 minutes.

9. The device of claim 8, wherein the curved, polymeric substrate is an optical lens.

10. The device of claim 8, wherein the curved, polymeric substrate has a minimum angle of curvature of at least about 20 degrees on at least a portion of a surface of the substrate.

11. The device of claim 8, wherein the at least one dielectric layer includes at least two dielectric layers with at least two different indices of refraction.

12. The device of claim 8, wherein the nanostructure is formed from a single layer of aluminum oxide deposited on the at least one dielectric layer using atomic layer deposition.

13. An antireflection optical device, comprising:
    a curved, polymeric substrate; and
    an antireflection coating formed on a surface of a curved portion of the curved, polymeric substrate, wherein the antireflection coating includes:
    at least one conformal dielectric layer formed on the curved portion of the substrate, wherein each conformal dielectric layer is formed by atomic layer deposition; and
    an aluminum oxide nanostructure formed directly on a second surface of the at least one dielectric layer that is most distal from the substrate;
    wherein the antireflection coating has an average reflectance of at most about 0.05% in a wavelength range of 400 nm to 700 nm at an angle of incidence between 0° and 30° across the surface of the curved, polymeric substrate.

14. The device of claim 13, wherein the aluminum oxide nanostructure includes a mixture of Boehmite, Gibbsite, and Bayerite.

15. The device of claim 13, wherein the aluminum oxide nanostructure includes a mixture of crystalline polymorphs of aluminum oxide, aluminum hydroxide, and aluminum oxide hydroxide.

16. The device of claim 13, wherein the curved, polymeric substrate is an optical lens.

17. The device of claim 13, wherein the at least one dielectric layer includes at least two dielectric layers with at least two different indices of refraction.

18. The device of claim 13, wherein the curved, polymeric substrate has a minimum angle of curvature of at least about 20 degrees on at least a portion of a surface of the substrate.

* * * * *